US010824282B2

(12) United States Patent
Vallett et al.

(10) Patent No.: US 10,824,282 B2
(45) Date of Patent: Nov. 3, 2020

(54) FABRIC TOUCH SENSOR

(71) Applicant: Drexel University, Philadelphia, PA (US)

(72) Inventors: Richard James Vallett, Cherry Hill, NJ (US); Ryan David Young, Philadelphia, PA (US); Robert Wallace Lehrich, Feasterville, PA (US); Christina Dickinson Kara, Philadelphia, PA (US); Genevieve Dion, Philadelphia, PA (US); Youngmoo Edmund Kim, Philadelphia, PA (US)

( * ) Notice: Subject to any disclaimer, the term of this patent is extended or adjusted under 35 U.S.C. 154(b) by 6 days.

(21) Appl. No.: 15/779,943

(22) PCT Filed: Nov. 30, 2016

(86) PCT No.: PCT/US2016/064108
§ 371 (c)(1),
(2) Date: May 30, 2018

(87) PCT Pub. No.: WO2017/095861
PCT Pub. Date: Jun. 8, 2017

(65) Prior Publication Data
US 2018/0329535 A1    Nov. 15, 2018

Related U.S. Application Data

(60) Provisional application No. 62/260,722, filed on Nov. 30, 2015.

(51) Int. Cl.
*G06F 3/044* (2006.01)
*G06F 3/0354* (2013.01)
(Continued)

(52) U.S. Cl.
CPC ............. *G06F 3/044* (2013.01); *D02G 3/441* (2013.01); *D04B 1/12* (2013.01); *G06F 3/0321* (2013.01);
(Continued)

(58) Field of Classification Search
CPC .... G06F 3/044; G06F 3/03547; G06F 3/0416; G06F 3/0321; G06F 3/0414;
(Continued)

(56) References Cited

U.S. PATENT DOCUMENTS 5,127,242 A * 7/1992 Mitsumoto .............. D04B 1/24
66/200
6,515,586 B1 2/2003 Wymore
(Continued)

FOREIGN PATENT DOCUMENTS

GB    2 115 556 A    9/1983
JP    2006-164925 A   6/2006
(Continued)

OTHER PUBLICATIONS

Humphries, M., "Fabric Reference," Fourth Edition, Chapter 4-5, New Jersey: Pearson Education Inc, pp. 154-167 (2009).
(Continued)

*Primary Examiner* — Chad M Dicke
(74) *Attorney, Agent, or Firm* — Schott P.C.

(57) ABSTRACT

A planar (two-dimensional, XY location) touch sensor may include a knitted structure and supplementary method of sensing detects human touch on a fabric surface. This sensor may be fully knitted and detect the continuous planar location and contact force of human touch along the surface of the structure. The fabric may conform to any arbitrary surface and may be a rectangle for touch pad applications. This sensor may be used for applications that include robotics and human-machine interaction, smart garments
(Continued)

and wearables, as well as medical textiles and flexible embedded sensors. This touch sensor may require as few as only two electrode connections from the fabric to sense both planar touch and pressure, which allows it to work in areas with limited space that allow for limited complexity for wiring.

17 Claims, 21 Drawing Sheets

(51) Int. Cl.
  G06F 3/041 (2006.01)
  G06F 3/03 (2006.01)
  H03K 17/96 (2006.01)
  D04B 1/12 (2006.01)
  D02G 3/44 (2006.01)

(52) U.S. Cl.
  CPC ........ *G06F 3/03547* (2013.01); *G06F 3/0414* (2013.01); *G06F 3/0416* (2013.01); *G06F 3/0418* (2013.01); *H03K 17/962* (2013.01); *D10B 2101/12* (2013.01); *D10B 2401/16* (2013.01); *D10B 2403/021* (2013.01); *D10B 2403/02431* (2013.01); *H03K 2217/960715* (2013.01)

(58) Field of Classification Search
  CPC ................ G06F 3/0418; H03K 17/962; H03K 2217/960715; D04B 1/12; D02G 3/441; D10B 2101/12; D10B 2403/021; D10B 2403/02431; D10B 2401/16
  See application file for complete search history.

(56) References Cited

U.S. PATENT DOCUMENTS

| | | | |
|---|---|---|---|
| 7,365,031 B2 | 4/2008 | Swallow et al. | |
| 7,377,133 B2 | 5/2008 | Sandbach et al. | |
| 7,430,925 B2 | 10/2008 | Son et al. | |
| 7,531,203 B2 | 5/2009 | Tao et al. | |
| 7,544,627 B2* | 6/2009 | Tao | D03D 1/0088 442/189 |
| 9,411,476 B2* | 8/2016 | Li | G06F 3/0416 |
| 9,715,319 B2* | 7/2017 | Marques | G06F 3/044 |
| 9,860,982 B1* | 1/2018 | Main | H05K 3/32 |
| 10,009,026 B2* | 6/2018 | Aliane | G06F 3/044 |
| 10,013,131 B2* | 7/2018 | Mizuhashi | G06F 3/0412 |
| 10,120,498 B2* | 11/2018 | Gray | G06F 3/044 |
| 10,156,029 B1* | 12/2018 | Podhajny | G06F 3/042 |
| 10,168,775 B2* | 1/2019 | Mastandrea | G06F 3/014 |
| 10,180,721 B2* | 1/2019 | Hoen | G06F 3/014 |
| 10,196,271 B2* | 2/2019 | Zhang | B82Y 10/00 |
| 10,234,965 B2* | 3/2019 | Qiao | G06F 3/03545 |
| 10,268,315 B2* | 4/2019 | McMillen | G01L 1/18 |
| 10,503,313 B2* | 12/2019 | Datta | G06F 3/0414 |
| 2002/0134116 A1 | 9/2002 | Sandbach | |
| 2006/0280322 A1* | 12/2006 | Abe | H01R 13/24 381/300 |
| 2007/0186667 A1 | 8/2007 | Deangelis et al. | |
| 2007/0202765 A1 | 8/2007 | Krans et al. | |
| 2008/0050550 A1 | 2/2008 | Orth | |
| 2008/0200085 A1 | 8/2008 | Van Bruggen et al. | |
| 2009/0272197 A1 | 11/2009 | Ridao Granado et al. | |
| 2010/0039269 A1 | 2/2010 | Newham | |
| 2010/0103112 A1 | 4/2010 | Yoo et al. | |
| 2011/0318985 A1 | 12/2011 | McDermid | |
| 2013/0066168 A1* | 3/2013 | Yang | A61B 5/0245 600/301 |
| 2014/0343392 A1 | 11/2014 | Yang | |
| 2015/0331523 A1* | 11/2015 | McMillen | G01L 1/18 345/174 |
| 2016/0018274 A1 | 1/2016 | Seitz | |
| 2016/0048235 A1 | 2/2016 | Poupyrev | |
| 2016/0209441 A1 | 7/2016 | Mazzeo et al. | |
| 2016/0209964 A1 | 7/2016 | McDermid | |
| 2016/0282988 A1 | 9/2016 | Poupyrev | |
| 2017/0017347 A1* | 1/2017 | Wilson | G06F 3/044 |
| 2017/0224280 A1* | 8/2017 | Bozkurt | G01L 5/0014 |

FOREIGN PATENT DOCUMENTS

| | | |
|---|---|---|
| WO | 00/26627 A1 | 5/2000 |
| WO | 2008/110250 A1 | 9/2008 |
| WO | 2016/053624 A1 | 4/2016 |
| WO | 2016/105885 A1 | 6/2016 |
| WO | 2016/130888 A1 | 8/2016 |
| WO | 2017/095861 A1 | 6/2017 |

OTHER PUBLICATIONS

Zhang, H., et al., "Electro-Mechanical Properties of Knitted Fabric Made From Conductive Multi-Filament Yarn Under Unidirectional Extension," Textile Research Journal, vol. 75, No. 8, pp. 598-606 (2005).

International Search Report and Written Opinion of the International Searching Authority for PCT Application No. PCT/US2016/064108 dated Feb. 17, 2017.

"Project Jacquard," accessed at https://web.archive.org/web/20160304012343/https://www.google.com/atap/project-acquard/, accessed on Jul. 23, 2018, pp. 1-9.

"Warp Knitting," Last updated: Mar. 14, 2018, accessed at https://www.textileschool.com/169/warp-knitting/, accessed on Nov. 22, 2018, pp. 5.

Alirezaei, H., et al., "A tactile distribution sensor which enables stable measurement under high and dynamic stretch," in IEEE Symposium on 3D User Interfaces, pp. 87-93 (2009).

Atalay, O., et al., "Textile-Based Weft Knitted Strain Sensors: Effect of Fabric Parameters on Sensor Properties," Sensors, vol. 13, No. 8, pp. 11114-11127 (2013).

Baker, M., et al., "Wearable Computing from Jewels to Joules [Guest editors' introduction]," IEEE Pervasive Computing, vol. 13, No. 4, pp. 20-22 (2014).

Barrett, G., and Omote, R., "Projected-Capacitive Touch Technology," Frontline Technology, pp. 16-21 (2010).

Büscher, G. H., et al., "Flexible and stretchable fabric-based tactile sensor," Robotics and Autonomous Systems, vol. 63, Part 3, pp. 244-252 (2015).

Castano, LM, and Flatau, AB, "Smart fabric sensors and e-textile technologies: a review," IOP Publishing Ltd, in Smart Materials and Structures, vol. 23, No. 5, pp. 1-27 (Apr. 2014).

Cheng, J., et al., "Designing Sensitive Wearable Capacitive Sensors for Activity Recognition," IEEE Sensors Journal, vol. 13, No. 10, pp. 3935-3947 (2013).

Cui, Z, et al., "Design and operation of silver nanowire based flexible and stretchable touch sensors," Journal of Materials Research, vol. 30, No. 01, pp. 79-85 (2015).

Kumar, F.,"Types of Warp Knitting Machines," Published on Dec. 10, 2017, accessed at https://textilestudycenter.com/types-warp-knitting-machines/, accessed on Nov. 21, 2018, pp. 1-14.

Li, C., et al., "k-Nearest-Neighbour based Numerical Hand Posture Recognition using a Smart Textile Glove," presented at the Ambient 2015: The Fifth International Conference on Ambient Computing, Applications, Services and Technologies, Nice, France, pp. 36-41 (2015).

OSD Manufacturing Technology Program, "Manufacturing Readiness Level (MRL) Deskbook," Department of Defense, Version 2.21, pp. 1-82 (Oct. 2012).

Paradiso, R., et al., "A wearable health care system based on knitted integrated sensors," IEEE Transactions on Information Technology in Biomedicine, vol. 9, No. 3, pp. 337-344 (2005).

Poupyrev, I., et al., "Project Jacquard: Interactive Digital Textiles at Scale," Everyday Objects as Interaction Surfaces, Proceeding CHI '16 Proceedings of the 2016 CHI Conference on Human Factors in Computing Systems, pp. 4216-4227 (2016).

(56) References Cited

OTHER PUBLICATIONS

Roh, J.S., "Textile touch sensors for wearable and ubiquitous interfaces," Textile Research Journal, vol. 84, No. 7, pp. 139-750 (2014).

Sato, Y., et al., "Development of Touch Panel System by Single Layer without Pattern: Capable Large Touch Panel due to large S/N and Simple Structure," 2013 3rd IEEE CPMT Symposium Japan, pp. 1-4 (2013).

Seyedin, S., et al., "Knitted Strain Sensor Textiles of Highly Conductive All-Polymeric Fibers," ACS Appl Mater Interfaces, vol. 7, No. 38, pp. 21150-21158 (2015).

Takamatsu, S., et al., "Fabric pressure sensor array fabricated with die-coating and weaving techniques," Sensors and Actuators A: Physical, vol. 184, pp. 57-63 (Sep. 2012).

Terzic, E., et al., "Capacitive Sensing Technology," in a Neural Network Approach to Fluid Quantity Measurement in Dynamic Environments, Springer London, pp. 11-37 (2012).

Trindade, I.G., et al., "Lightweight Portable Sensors for Health Care," The 12th IEEE International Conference on e-Health Networking, Applications and Services, accessed at http://www.academia.edu/5451330/Lightweight_Portable_Sensors_for Health_Care, accessed on Jan. 28, 2016, pp. 175-179 (2010).

Wu, W., et al., "Taxel-Addressable Matrix of Vertical-Nanowire Piezotronic Transistors for Active and Adaptive Tactile Imaging," Science, vol. 340, No. 6135, pp. 952-957 (May, 2013).

Yao, S., and Zhu, Y., "Wearable multifunctional sensors using printed stretchable conductors made of silver nanowires," Nanoscale, vol. 6, No. 4, pp. 2345-2352 (2014).

Yilmaz, T., et al., "Detecting Vital Signs with Wearable Wireless Sensors," Sensors, vol. 10, No. 12, pp. 10837-10862 (2010).

Zeagler, C., et al., "Can I Wash It?: The Effect of Washing Conductive Materials Used in Making Textile Based Wearable Electronic Interfaces," in Proceedings of the 2013 International Symposium on Wearable Computers, pp. 143-144 (2013).

Zhang, H., et al., "Conductive knitted fabric as large-strain gauge under high temperature,"Sensors and Actuators A: Physical, vol. 126, No. 1, pp. 129-140 (2006).

\* cited by examiner $$
\begin{bmatrix}
G_A & -G_A & 0 & 0 & 0 & \cdots & 0 & 0 & 0 & 0 & 0 \\
-G_A & (G_A + G_{K_0} + sC_{P_A}) & -G_{K_0} & 0 & 0 & \cdots & 0 & 0 & 0 & 0 & 0 \\
0 & -G_{K_0} & (G_{K_0} + G_{K_1} + sC_{t_1}) & -G_{K_1} & 0 & \cdots & 0 & 0 & 0 & 0 & 0 \\
0 & 0 & -G_{K_1} & (G_{K_1} + G_{K_2} + sC_{t_2}) & \cdots & & 0 & 0 & 0 & 0 & 0 \\
\vdots & \vdots & \vdots & \vdots & \ddots & \vdots & \vdots & \vdots & \vdots & \vdots & \vdots \\
0 & 0 & 0 & \cdots & (G_{K_{n-2}} + G_{K_{n-1}} + sC_{t_{n-1}}) & -G_{K_{n-1}} & 0 & 0 & 0 \\
0 & 0 & 0 & \cdots & -G_{K_{n-1}} & (G_{K_{n-1}} + G_{K_n} + sC_{t_n}) & -G_{K_n} & 0 & 0 \\
0 & 0 & 0 & \cdots & 0 & -G_{K_n} & (G_{K_n} + G_B + sC_{P_B}) & -G_B & 0 \\
0 & 0 & 0 & \cdots & 0 & 0 & -G_B & G_B & 1 \\
0 & 0 & 0 & \cdots & 0 & 0 & 0 & 1 & 0 \\
1 & 0 & 0 & \cdots & 0 & 0 & 0 & 0 & 0
\end{bmatrix}
=
\begin{bmatrix}
V_A \\ O_A \\ e_1 \\ e_2 \\ \vdots \\ e_{n-1} \\ e_n \\ V_B \\ iV_A \\ iV_B
\end{bmatrix}
$$

FIG. 12

EQUATION 11

$$\begin{bmatrix} G_A & 0 & 0 & 0 & \cdots & 0 & 0 & 0 & 0 & 0 \\ -G_A & -G_{K_0} & 0 & 0 & \cdots & 0 & 0 & 0 & 0 & 1 \\ 0 & (G_{K_0}+G_{K_1}+sC_{t_1}) & -G_{K_1} & 0 & \cdots & 0 & 0 & 0 & 0 & 0 \\ 0 & -G_{K_1} & (G_{K_1}+G_{K_2}+sC_{t_2}) & \cdots & 0 & 0 & 0 & 0 & 0 & 0 \\ \vdots & \vdots & \vdots & \vdots & \ddots & \vdots & \vdots & \vdots & \vdots & \vdots \\ 0 & 0 & 0 & \cdots & (G_{K_{n-2}}+G_{K_{n-1}}+sC_{t_{n-1}}) & -G_{K_{n-1}} & 0 & 0 & 0 & 0 \\ 0 & 0 & 0 & \cdots & -G_{K_{n-1}} & (G_{K_{n-1}}+G_{K_n}+sC_{t_n}) & -G_{K_n} & 0 & 0 & 0 \\ 0 & 0 & 0 & \cdots & 0 & -G_{K_n} & (G_{K_n}+G_B+sC_{P_B}) & -G_B & 0 & 0 \\ 0 & 0 & 0 & \cdots & 0 & 0 & -G_B & G_B & 0 & 1 \\ V_A & & & & & & & & & \\ V_B & & & & & & & & & \end{bmatrix}$$

(EQUATION 12a)

FIG. 13A $$O_B(s) = \begin{bmatrix} G_A & -G_A & 0 & 0 & \cdots & 0 & 0 & 0 & 0 & 0 & 1 & 0 \\ -G_A & (G_A+G_{K_0}+sC_{P_A}) & -G_{K_0} & 0 & \cdots & 0 & 0 & 0 & 0 & 0 & 0 & 0 \\ 0 & -G_{K_0} & (G_{K_0}+G_{K_1}+sC_{t_1}) & -G_{K_1} & \cdots & 0 & 0 & 0 & 0 & 0 & 0 & 0 \\ 0 & 0 & -G_{K_1} & (G_{K_1}+G_{K_2}+sC_{t_2}) & \cdots & 0 & 0 & 0 & 0 & 0 & 0 & 0 \\ \vdots & \vdots & \vdots & \vdots & \ddots & \vdots & \vdots & \vdots & \vdots & \vdots & \vdots & \vdots \\ 0 & 0 & 0 & 0 & \cdots & (G_{K_{n-2}}+G_{K_{n-1}}+sC_{t_{n-1}}) & -G_{K_{n-1}} & 0 & 0 & 0 & 0 & 0 \\ 0 & 0 & 0 & 0 & \cdots & -G_{K_{n-1}} & (G_{K_{n-1}}+G_{K_n}+sC_{t_n}) & -G_{K_n} & 0 & 0 & 0 & 0 \\ 0 & 0 & 0 & 0 & \cdots & 0 & -G_{K_n} & 0 & -G_B & G_B & 0 & 0 \\ 0 & 0 & 0 & 0 & \cdots & 0 & 0 & 0 & V_A & 0 & 0 & 0 \\ 1 & 0 & 0 & 0 & \cdots & 0 & 0 & 0 & V_B & 1 & 0 & 0 \end{bmatrix}$$

(EQUATION 12b)

FIG. 13B $$\Delta = \begin{vmatrix} -G_A & 0 & 0 & \cdots & 0 & 0 & 0 & 0 & 0 \\ G_A & (G_A+G_{K_0}+sC_{P_A}) & -G_{K_0} & 0 & \cdots & 0 & 0 & 0 & 0 & 0 \\ -G_A & -G_{K_0} & (G_{K_0}+G_{K_1}+sC_{t_1}) & -G_{K_1} & \cdots & 0 & 0 & 0 & 0 & 0 \\ 0 & 0 & -G_{K_1} & (G_{K_1}+G_{K_2}+sC_{t_2}) & \cdots & 0 & 0 & 0 & 0 & 0 \\ \vdots & \vdots & \vdots & \vdots & \ddots & \vdots & \vdots & \vdots & \vdots & \vdots \\ 0 & 0 & 0 & 0 & \cdots & (G_{K_{n-2}}+G_{K_{n-1}}+sC_{t_{n-1}}) & -G_{K_{n-1}} & 0 & 0 & 0 \\ 0 & 0 & 0 & 0 & \cdots & -G_{K_{n-1}} & (G_{K_{n-1}}+G_{K_n}+sC_{t_n}) & -G_{K_n} & 0 & 0 \\ 0 & 0 & 0 & 0 & \cdots & 0 & -G_{K_n} & (G_{K_n}+G_B+sC_{P_B}) & -G_B & 0 \\ 0 & 0 & 0 & 0 & \cdots & 0 & 0 & -G_B & G_B & 1 \\ 0 & 0 & 0 & 0 & \cdots & 0 & 0 & 0 & 1 & 0 \end{vmatrix}$$

(EQUATION 12c)

*FIG. 13C*

$$\begin{bmatrix} G_A & -G_A & 0 & 0 & 1 & 0 \\ -G_A & (G_A + G_{K_0} + sC_{P_A}) & -G_{K_0} & 0 & 0 & 0 \\ 0 & -G_{K_0} & (G_{K_0} + G_B + sC_{P_B}) & -G_B & 0 & 0 \\ 0 & 0 & -G_B & G_B & 0 & 1 \\ 1 & 0 & 0 & 0 & 0 & 0 \\ 0 & 0 & 0 & 1 & 0 & 0 \end{bmatrix} \begin{bmatrix} V_A \\ O_A \\ O_B \\ V_B \\ iV_A \\ iV_B \end{bmatrix} = \begin{bmatrix} 0 \\ 0 \\ 0 \\ 0 \\ V_A \\ V_B \end{bmatrix}$$

$$V_{OA}(s) = \frac{\begin{vmatrix} G_A & 0 & 0 & 0 & 1 & 0 \\ -G_A & 0 & -G_{K_0} & 0 & 0 & 0 \\ 0 & 0 & (G_{K_0} + G_B + sC_{P_B}) & -G_B & 0 & 0 \\ 0 & 0 & -G_B & G_B & 0 & 1 \\ 1 & V_A & 0 & 0 & 0 & 0 \\ 0 & V_B & 0 & 1 & 0 & 0 \end{vmatrix}}{\Delta}$$

$$V_{OB}(s) = \frac{\begin{vmatrix} G_A & -G_A & 0 & 0 & 1 & 0 \\ -G_A & (G_A + G_{K_0} + sC_{P_A}) & 0 & 0 & 0 & 0 \\ 0 & -G_{K_0} & 0 & -G_B & 0 & 0 \\ 0 & 0 & 0 & G_B & 0 & 1 \\ 1 & 0 & V_A & 0 & 0 & 0 \\ 0 & 0 & V_B & 1 & 0 & 0 \end{vmatrix}}{\Delta}$$

$$\Delta = |A| = G_A G_B + G_A G_{K_0} + G_B G_{K_0} + (C_{P_B} G_A + C_{P_A} G_B + C_{P_A} G_{K_0} + C_{P_B} G_{K_0})s + C_{P_A} C_{P_B} s^2$$

$$\frac{V_{OA}(s)}{=V_{CC}} \frac{G_A G_B + G_A G_{K_0} + G_B G_{K_0} + C_{P_B} G_A s}{G_A G_B + G_A G_{K_0} + G_B G_{K_0} + (C_{P_B} G_A + C_{P_A} G_B + C_{P_A} G_{K_0} + C_{P_B} G_{K_0})s + C_{P_A} C_{P_B} s^2}$$

$$\frac{V_{OB}(s)}{=V_{CC}} \frac{G_A G_B + G_A G_{K_0} + G_B G_{K_0} + C_{P_A} G_B s}{G_A G_B + G_A G_{K_0} + G_B G_{K_0} + (C_{P_B} G_A + C_{P_A} G_B + C_{P_A} G_{K_0} + C_{P_B} G_{K_0})s + C_{P_A} C_{P_B} s^2}$$

$$a_0 = C_{P_A} C_{P_B}$$
$$a_1 = C_{P_B} G_A + C_{P_A} G_B + C_{P_A} G_{K_0} + C_{P_B} G_{K_0}$$
$$a_2 = G_A G_B + G_A G_{K_0} + G_B G_{K_0}$$

$$\frac{a_1}{a_0} = \frac{G_A + G_{K_0}}{C_{P_B}} + \frac{G_B + G_{K_0}}{C_{P_A}}$$

$$\frac{a_2}{a_0} = \frac{G_A G_B + G_A G_{K_0} + G_B G_{K_0}}{C_{P_A} C_{P_B}}$$

$$V_{e_2}(s) = VCC \frac{b_2 + b_1 s}{a_2 + a_1 s + a_0 s^2}$$

$$V_{e_2}(s) = VCC \frac{\frac{2}{a_0} + \frac{b_1}{a_0} s}{\frac{a_2}{a_0} + \frac{a_1}{a_0} s + s^2}$$

$$A = \begin{bmatrix} -\frac{a_1}{a_0} & -\frac{a_2}{a_0} \\ 1 & 0 \end{bmatrix}, \quad B = \begin{bmatrix} 1 \\ 0 \end{bmatrix}, \quad C = \begin{bmatrix} \frac{b_1}{a_0} & \frac{b_2}{a_0} \end{bmatrix}, \quad D = 0$$

$$\lambda_A = -\frac{\left(\frac{a_1}{a_0}\right)}{2} \pm \frac{\left(\left(\frac{a_1}{a_0}\right)^2 - 4\left(\frac{a_2}{a_0}\right)\right)^{\frac{1}{2}}}{2}$$

$$\frac{a_1}{a_0} = \frac{G_A + G_{K_O}}{C_{P_B}} + \frac{G_B + G_{K_O}}{C_{P_A}}$$

$$\frac{a_2}{a_0} = \frac{G_A G_B + G_A G_{K_O} + G_B G_{K_O}}{C_{P_A} C_{P_B}}$$

FIG. 15

POLES AND ZERO OF SYSTEM

$$Z = -\frac{(G_A G_B + G_A G_{K_O} + G_B G_{K_O})}{C_{P_B} G_A}$$

$$\rho = \frac{-(C_{P_B} G_A + C_{P_A} G_B + C_{P_A} G_{K_O} + C_{P_B} G_{K_O}) \pm \sqrt{(C_{P_B} G_A + C_{P_A} G_B + C_{P_A} G_{K_O} + C_{P_B} G_{K_O})^2 - 4(C_{P_A} C_{P_B})(G_A G_B + G_A G_{K_O} + G_B G_{K_O})}}{2 C_{P_A} C_{P_B}}$$

EXPANDING THE RADICAL

$$(C_{P_B} G_A + C_{P_A} G_B + C_{P_A} G_{K_O} + C_{P_B} G_{K_O})^2 - 4(C_{P_A} C_{P_B})(G_A G_B + G_A G_{K_O} + G_B G_{K_O})$$

$$C_{P_B} G_A = a$$
$$C_{P_A} G_B = b$$
$$C_{P_B} G_{K_O} = c$$
$$C_{P_A} G_{K_O} = d$$

$$a^2 + 2ab + 2ac + 2ad + b^2 + 2bc + 2bd + c^2 + 2cd + d^2 - 4ab - 4a - 4bc$$
$$a^2 - 2ab + 2ac - 2ad + b^2 - 2bc + 2bd + c^2 + 2cd + d^2$$
$$(-a + b - c + d)(\ )$$

$$p = \frac{-(C_{P_B} G_A + C_{P_A} G_B + C_{P_A} G_{K_O} + C_{P_B} G_{K_O}) \pm (C_{P_B} G_A - C_{P_A} G_B + C_{P_A} G_{K_O} - C_B G_{K_O})}{2 C_{P_A} C_{P_B}}$$

$$\begin{bmatrix} G_A & -G_A & 0 & 0 & 0 & 0 & 1 & 0 \\ -G_A & (G_A+G_{K_0}+sC_{P_A}) & -G_{K_0} & 0 & 0 & 0 & 0 & 0 \\ 0 & -G_{K_0} & (G_{K_0}+G_{K_1}+sC_{t_1}) & -G_{K_1} & 0 & 0 & 0 & 0 \\ 0 & 0 & -G_{K_1} & (G_{K_1}+G_{K_2}+sC_{t_2}) & -G_{K_2} & 0 & 0 & 0 \\ 0 & 0 & 0 & -G_{K_2} & (G_{K_2}+G_B+sC_{P_B}) & -G_B & 0 & 0 \\ 0 & 0 & 0 & 0 & -G_B & G_B & 0 & 1 \\ 1 & 0 & 0 & 0 & 0 & 0 & 0 & 0 \\ 0 & 0 & 0 & 0 & 0 & 1 & 0 & 0 \end{bmatrix} \begin{bmatrix} V_A \\ O_A \\ e_1 \\ e_2 \\ O_A \\ V_B \\ i_{V_A} \\ i_{V_B} \end{bmatrix}$$

$$= \begin{bmatrix} 0 \\ 0 \\ 0 \\ 0 \\ 0 \\ 0 \\ V_A \\ V_B \end{bmatrix}$$

$$\begin{bmatrix} G_A & -G_A & 0 & 0 & 0 & 0 \\ -G_A & (G_A+G_{K_0}+sC_{P_A}) & -G_{K_0} & 0 & 0 & 0 \\ 0 & -G_{K_0} & (G_{K_0}+G_{K_1}+sC_{t_1}) & -G_{K_1} & 0 & 0 \\ 0 & 0 & -G_{K_1} & (G_{K_1}+G_{K_2}+sC_{t_2}) & -G_{K_2} & 0 \\ 0 & 0 & 0 & -G_{K_2} & (G_{K_2}+G_B+sC_{P_B}) & -G_B \\ 0 & 0 & 0 & 0 & -G_B & G_B \end{bmatrix}$$

$V_{O_A}(S) = G_A G_B G_{K_0} G_{K_1} V_A + G_A G_B G_{K_0} G_{K_2} V_A + G_A G_B G_{K_1} G_{K_2} V_A + G_A G_{K_0} G_{K_1} G_{K_2} V_A$
$\quad + G_B G_{K_0} G_{K_1} G_{K_2} V_B + C_{P_B} G_A G_{K_0} G_{K_1} V_A s + C_{P_B} G_A G_{K_0} G_{K_2} V_A s$
$\quad + C_{P_B} G_A G_{K_1} G_{K_2} V_A s + C_{t_1} G_A G_B G_{K_1} V_A s + C_{t_2} G_A G_B G_{K_0} V_A s$
$\quad + C_{t_1} G_A G_B G_{K_2} V_A S + C_{t_2} G_A G_B G_{K_1} V_A S + C_{t_1} G_A G_{K_1} G_{K_2} V_A S$
$\quad + C_{t_2} G_A G_{K_0} G_{K_2} V_A S + C_{t_2} G_A G_{K_1} G_{K_2} V_A S + C_{P_B} C_{t_1} C_{t_2} G_A V_A S^3$
$\quad + C_{P_B} C_{t_1} G_A G_{K_1} V_A S^2 + C_{P_B} C_{t_2} G_A G_{K_0} V_A S^2 + C_{P_B} C_{t_1} G_A G_{K_2} V_A S^2$
$\quad + C_{P_B} C_{t_2} G_A G_{K_1} V_A S^2 + C_{t_1} C_{t_2} G_A G_B V_A S^2 + C_{t_1} C_{t_2} G_A G_{K_2} V_A S^2$ $V_{O_A}(S)$

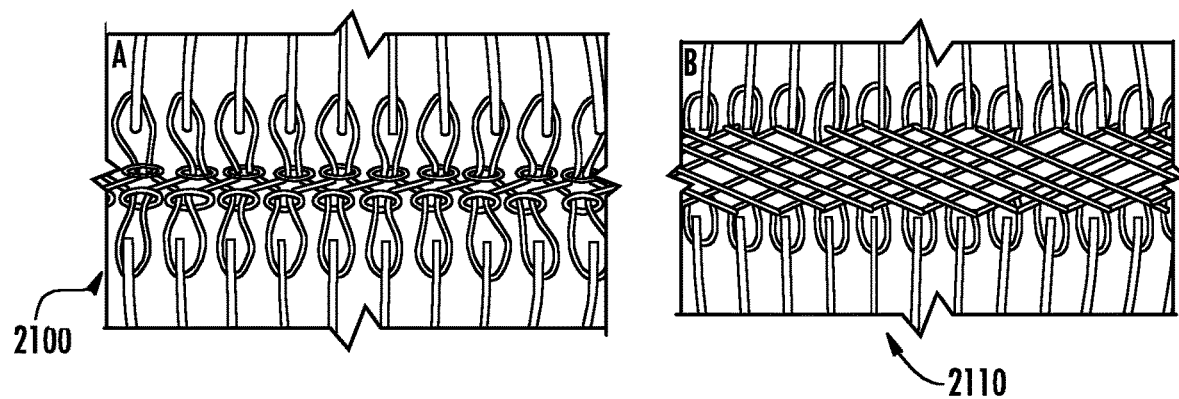
FIG. 21A  FIG. 21B
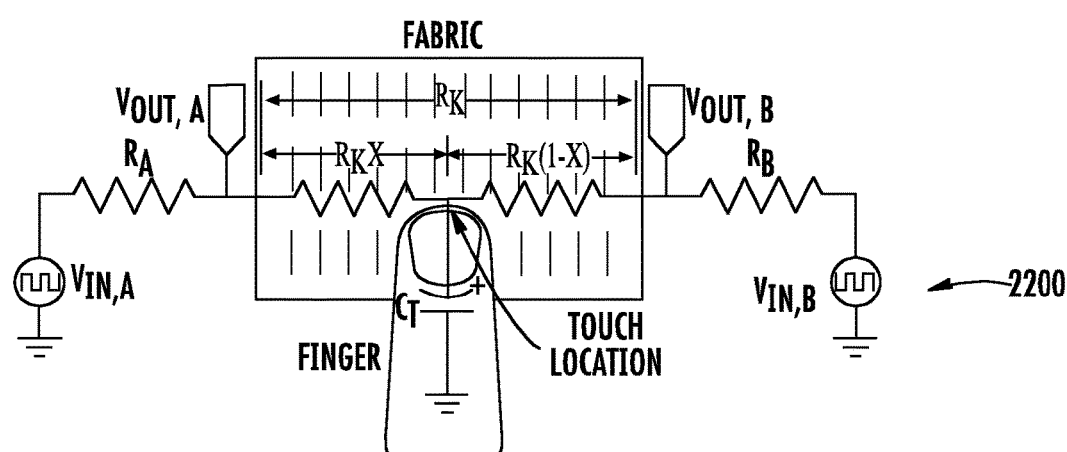
FIG. 22

FABRIC TOUCH SENSOR

BACKGROUND

Several groups have begun conducting research on the production of soft flexible touch sensors. Recently, Google's Project Jaquard developed a method of using industry standard jacquard machinery to produce textiles with integrated sensors for use in bespoke smart garments. Georgia Tech's Healthcare Robotics Lab developed silicone sensors with "taxels"—tactile pixels—used to characterize force applied to a robotic arm. Other methods have also been investigated such as use of conductive rubber, layering of piezo-resistive and conductive textiles, combinations of conductive knit or woven textiles and threads, screen printing, splicing of optical sensors into individual fibers and knitting of structures containing silver coated nylon, stainless steel, and carbon or polymeric conductive yarns. Sensors knit with carbon fiber filament show may improve the sensitivity of wearable devices. The knitting process helps with consistency of the design, while the carbon fiber has been shown to function well in a wider range of conditions.

While progress has been made, many of these solutions still face a number of challenges with respect to manufacturability and robustness. Hard and fragile embedded electronic components and the need for bundles of wire leads often diminish the feasibility of some solutions. Human factors can change the efficacy of these devices, for instance, the need to recalibrate antenna components that can function at different frequencies on the human body than in free space. Particularly in the case of sewn sensors, the production process is lengthy, complex, and cannot easily conform to exact measurements. Additionally, the need to wash and clean these garments or medical devices with sensors will arise, adding complexity to the design and production.

Previous fabric-based touch sensing has required a large number of sensing electrodes (wires) to form a discrete sensing mesh or has used a dense weaving of conductive yarn in an XY grid pattern to sense human touch using self-capacitance or mutual capacitance. Covering a surface with discrete electrodes is impractical for scalability of the sensor as it increases the number of required connections to a sensing integrated circuit.

SUMMARY OF THE EMBODIMENTS

A planar (two-dimensional, XY location) touch sensor may include a knitted structure and supplementary method of sensing detects human touch on a fabric surface. This sensor may be fully knitted and detect the continuous planar location and contact force of human touch along the surface of the structure. The fabric may conform to any arbitrary surface and may be a rectangle for touch pad applications. This sensor may be used for applications that include robotics and human-machine interaction, smart garments and wearables, as well as medical textiles and flexible embedded sensors. This touch sensor may require as few as only two electrode connections from the fabric to sense both planar touch and pressure, which allows it to work in areas with limited space that allow for limited complexity for wiring.

BRIEF DESCRIPTION OF THE DRAWINGS

FIG. 12 shows the Equation 11.

FIGS. 13A-C show Equations 12a-c.

FIGS. 14-18 show summary mathematical reductions of the mathematics performed to determine certain data from the sensor.

FIGS. 21A and 21B show an interlock knit stitch pattern and spacer knit stitch pattern.

FIG. 22 shows a fabric circuit sensing diagram.

DETAILED DESCRIPTION OF THE EMBODIMENTS

Introduction

Figure 1A:
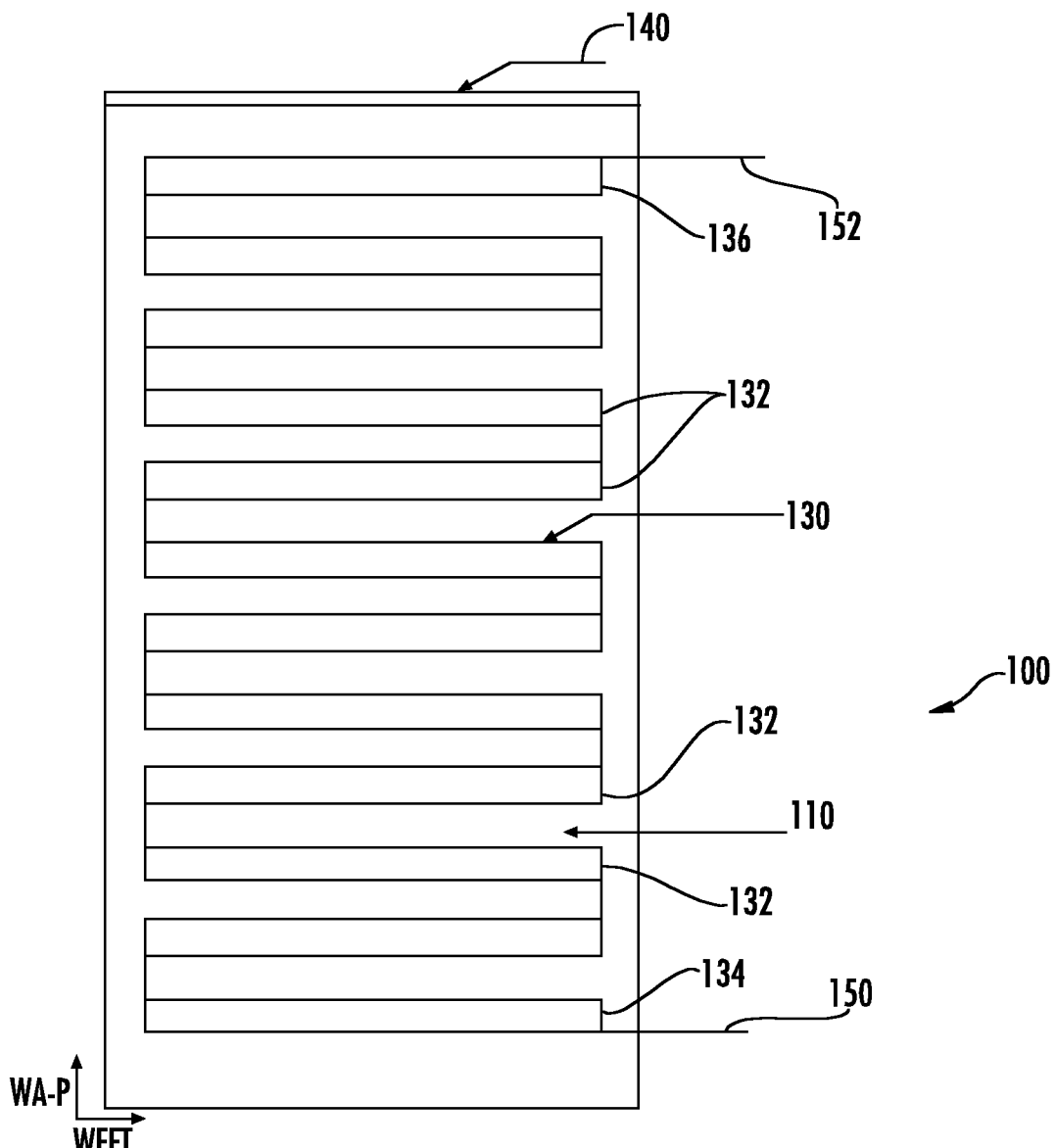
FIGS. 1A and 1B shows a sensor structure comprising three layers of knitted fabric: a nonconductive layer, a spacer fabric layer, and a conductive sensing element layer.

A planar (two-dimensional, XY location) touch sensor may include a knitted structure and supplementary method of sensing detects human touch on a fabric surface. This sensor may be fully knitted and detect the continuous planar location and contact force of human touch along the surface of the structure. The fabric may conform to any arbitrary surface and may be a rectangle for touch pad applications. This sensor may be used for applications that include robotics and human-machine interaction, smart garments and wearables, as well as medical textiles and flexible embedded sensors.

This touch sensor may require as few as only two electrode connections from the fabric to sense both planar touch and pressure, which allows it to work in areas with limited space that allow for limited complexity for wiring. The sensor may be scaled to fit large and arbitrary surfaces and material efficiency due to needing only two wire connections. The knitted structure may include a single piece using industry standard flatbed knitting techniques. Furthermore, the knitted structure may require no embedded electronic or solid components to be placed in the fabric which allows the sensor to be flexible and resilient.

Touch-sensitive interfaces offer unique and robust levels of interaction between users and touch-enabled devices. In the last 10 years, human computer interaction (HCI) reaped tremendous benefit from the design and development of such interfaces, now ubiquitous in smartphones and tablets. Other HCI areas, such as robotics and wearable technology, could benefit from sensors that detect touch, especially if they could be made soft and flexible. The number of touch sensing applications is poised to increase as research and development of soft touch sensors is pursued—specifically in the development of smart textiles for wearable applications and soft robotics.

A soft wearable interface could aid in patient-physician interaction, helping to remotely and comfortably monitor health conditions. As a smart garment component, soft sensors could be used as a means of entering information into a device or to provide kinesthetic feedback to the wearer. These sensors could even act as controls to "alter" properties of the garment when combined with other smart materials that can modulate color or temperature. In the field of robotics, soft touch sensors could improve the quality of human-robot interaction. While low cost depth cameras have revolutionized aspects of human-robot interaction in terms of environment mapping and kinematic planning, tactile sensing, which directly correlates to the robot's dynamics, is often neglected. This is due in part to rigid construction and control schemes which cannot account for unplanned collisions. Soft sensors would alleviate some of these issues by allowing deformation at contact points which may well relax tighter kinematic constraints and further enhance the ability for robots to operate in a wide range of environments.

Knitting may be one method of producing soft, flexible sensors that addresses some of the challenges mentioned above. Knitting is a method of fabric production that has existed for thousands of years, and has been successfully mechanized over the past several hundred years. Weft knitting is the intermeshing of horizontal rows of loops to create a fabric that can stretch in both the horizontal and vertical directions. When automated, the process becomes a type of additive manufacturing and rapid prototyping similar to 3D printing as it creates a substrate by adding layers on top of layers. However, digital knitting provides a number of advantages over the more recently developed 3D printing technologies. Software suites used with Shima Seiki industrial knitting machines can virtually drape garments and simulate the knitting process to evaluate designs before production. Additionally, a wide range of materials in the form of yarn have already been tested and established for use in knitting machines. Furthermore, garments can be knit with multiple materials seamlessly within the same piece of textile. The process creates little waste and, if only a small quantity of a material is available for testing, it can still be incorporated in small segments. Seamless knitting also eliminates potential points of structural weakness and provides a platform for the development of soft circuitry. When combined with techniques such as knitted spacer fabrics, knitting can be used to create 3D forms that are suitable for electronic devices while remaining soft, flexible, and comfortable for use in garments.

Designers with knowledge of materials engineering envision functional and aesthetically pleasing products while taking into consideration material capabilities. Materials scientists and engineers with knowledge of human factors work to design, produce, and characterize new materials or utilize and provide an understanding of existing materials that will fulfill the functional and aesthetic needs the final product and provide insight into the end-user's interaction. Mechanical and electrical engineers with knowledge of design assist with characterization of textile structure and assess their physical and electrical properties and make changes that feed back into the designers' original concept. Together, these groups work at the intersection between theirs and others' disciplines to incorporate both design and engineering into creating a textile-based sensor.

Sensor Structure

Figure 1B:
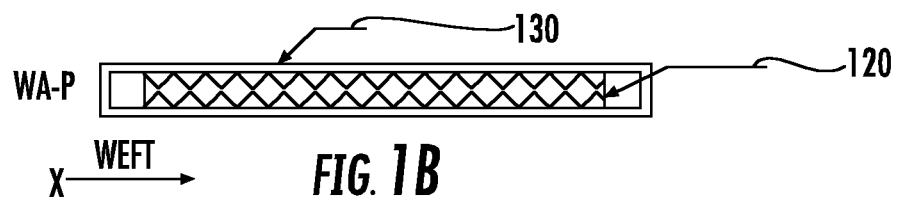

FIGS. 1A and 1B show a sensor structure 100 comprising three layers of knitted fabric: a nonconductive layer 110, a spacer fabric layer 120, and a conductive sensing element layer 130. The nonconductive layer 110 may be a standard cotton, wool, or synthetic yarn knitting that provides electrical isolation between the rows 132 of the sensing element pattern. The nonconductive layer 110 acts as the sensor 100's backing to prevent unwanted electrical contact with the sensing element layer 130. The spacer fabric layer 120 comprises a knitted high-bulk nylon that provides a tactile rigidity for the sensing element 100 and resists longitudinal deformation of the sensing element layer 130. The nonconductive layer 110 and the sensing element layer 130 may completely enclose the spacer fabric layer 120, as best shown in FIG. 1B.

Figure 2:
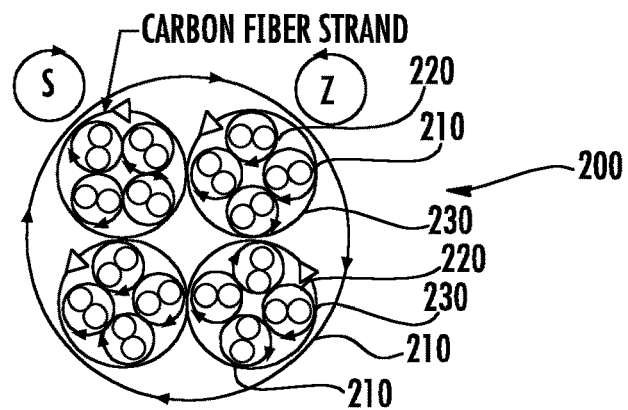
FIG. 2 shows a cross section of the conductive carbon fiber yarn.
Figure 2A:
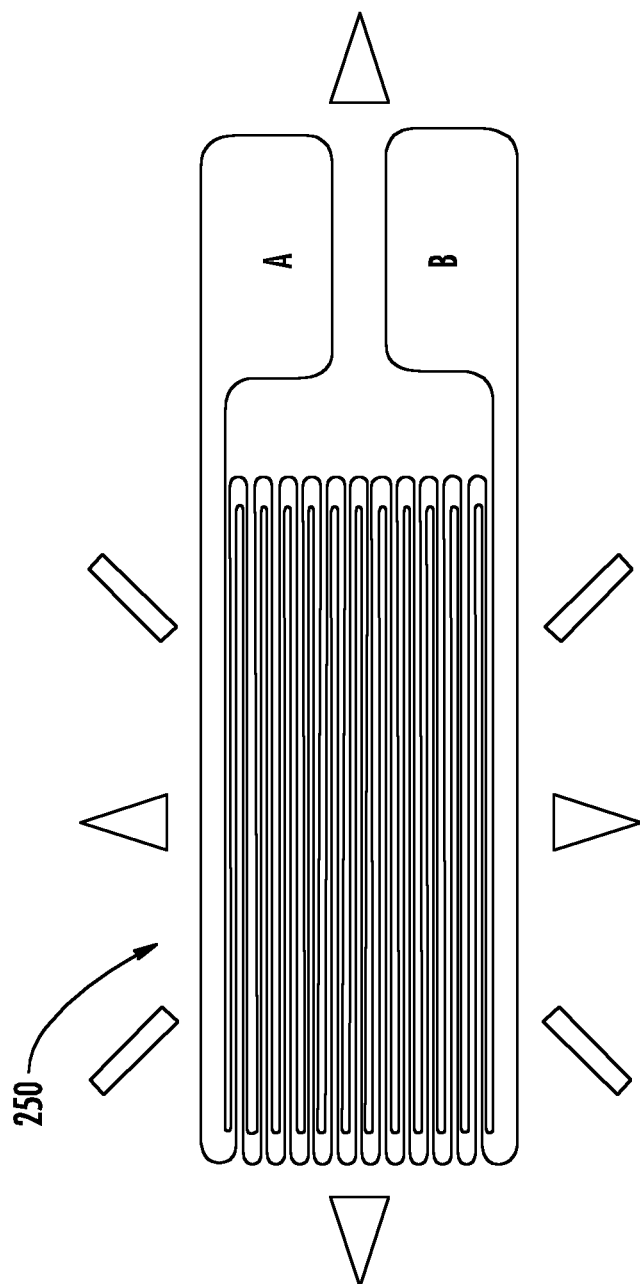
FIG. 2A shows a resistive strain gauge.

A conductive yarn 200 may form the patterned sensing element 130. The conductive yarn 200 may be a multi-strand twisted monofilament carbon fiber yarn shown in more detail in FIG. 2. The carbon fiber yarn 200 is a continuous knitted strip traversing the face of the sensor 130 alternating in the horizontal (weft) direction from the base to the top of the rectangular structure in a pattern similar to that of a resistive strain gauge 250 shown in FIG. 2A. Additionally, the structure may include a heat melt yarn 140 at a top seam that is steam-sealed to prevent the fabric from unraveling. Electrodes (not shown) may attach to the endpoints 134, 136 of the carbon fiber layer 130 at the yarn entry and exit outputs 150, 152.

Yarn Structure

The sensing element 130 may include a spun stranded monofilament carbon fiber yarn 200 comprised of multiple strands 210 wound together. Each successive yarn wrapping may be counter-twisted (S and Z twisted) to balance the yarn 200, for example 2S-4Z-4S shown in FIG. 2. As shown, pairs of strands 210 twist clockwise to form dual strands 220. 4 dual strands may be counterclockwise-twisted to form an octet strand 230. And four octet strands 230 form may be twisted clockwise to form a single fiber yarn 200. Different strand combinations are of course possible.

The resistivity of a single strand of carbon fiber filament may be approximately 1 M$\Omega$ per inch. The yarn impedance is determined by the number of strands twisted into the yarn. This number is calculated as a function of the size of the sensing area, the desired stitch pattern, and the stitch tightness. The impedance of the sensing element is matched to the impedance of the current limiting resistors used in the circuit to attain the best signal results. The average capacitance induced by touch is typically between 70 to 120 pico-Farads (pF). The average observed parasitic capacitance is typically between 6 to 20 pF. Resistor values close to 1 Mega-Ohm (M$\Omega$) are ideal for both the current limiting resistors and the total resistance of the sensing element. This value yields a measurable signal rise time without increasing the voltage fluctuations induced from parasitic capacitance.

Single-Touch Sensing Method

Figure 3A:
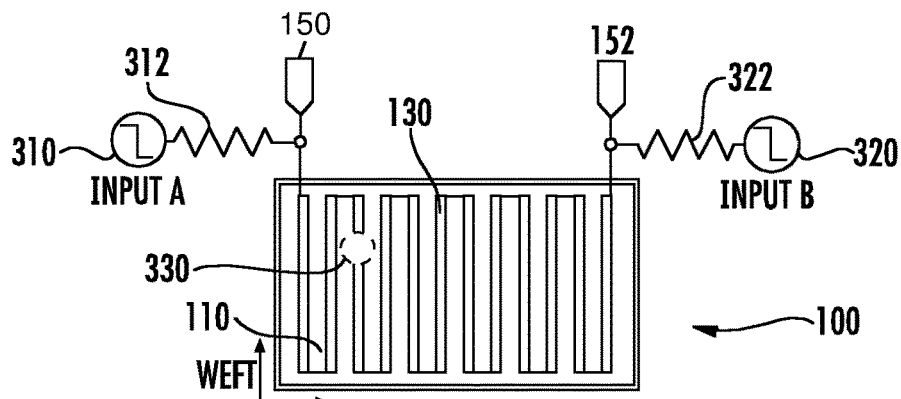
FIG. 3A shows the sensor structure in use.
Figure 3B:
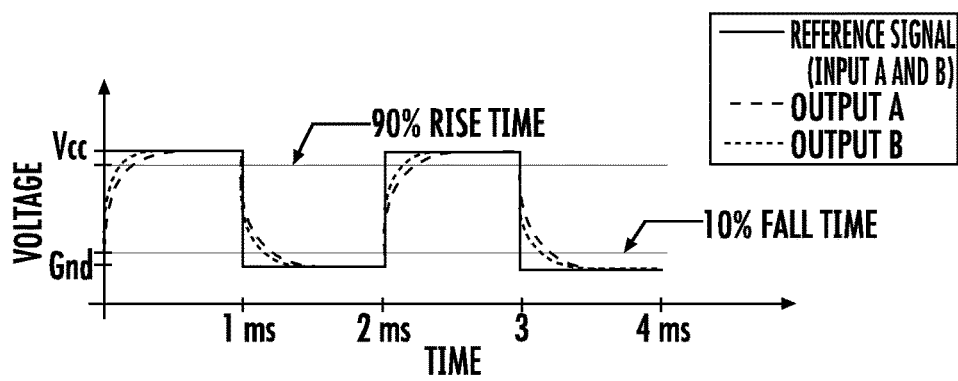
FIG. 3B shows an example of input signals given a square wave input.
Figure 4:
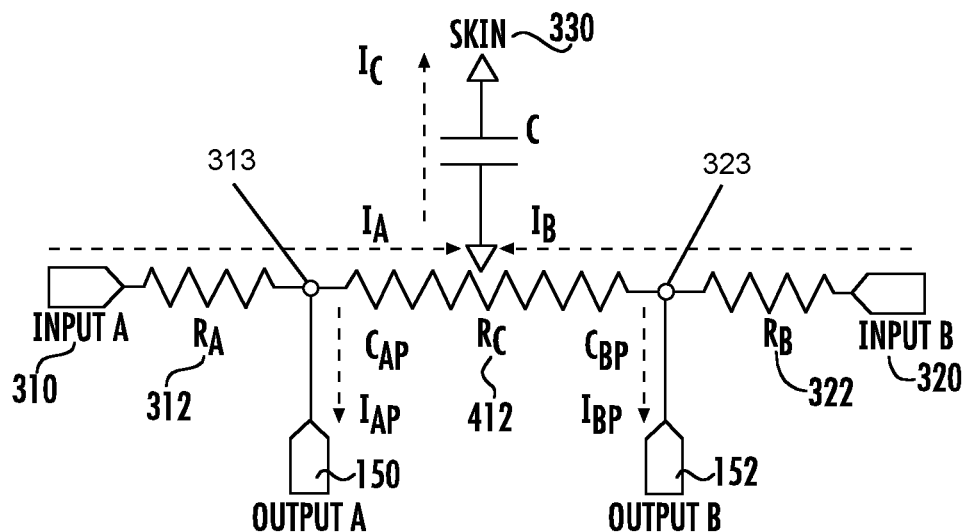
FIG. 4 shows the resistor circuit.

FIG. 3B and FIG. 4 show the sensor 100 measures a human touch location 330 by means of self-capacitance. Human skin introduces a capacitive connection between the sensing element 100 and the electrical potential of the human body, which alters the shape of a reference signal. The sensor 100 may interface with an external microcontroller (such as an Atmel SAM3X8E) and filter circuit. The microcontroller may generate a 500 Hz square wave input with a 50% duty cycle to both first inputs 310, 320 of the conductive sensing element, though the frequency is variable. The pulses are timed to charge and discharge synchronously. Capacitance is measured by examining the voltage change between first and second current limiting resistors 312, 322 and the sensing element 130. These current limiting resistors 312, 322 and first and second exit outputs 150, 152 are separated by first and second nodes 313, 323. The resistor-capacitor (RC) rise time is found through measuring the time needed to charge/discharge the circuit to 90%/10% of the operating voltage. FIG. 3B shows an example waveform output based on touch position.

In use, the sensor 100 first uses a self-calibration routine to measure both the baseline parasitic capacitance and unknown total impedance. This routine is important to account for the uncertainties in the resistor matching as well as changes in impedance due to deformation of the sensor. The sensor 100 self-calibrates by setting the voltage high and low at either input of the sensor and measuring the voltage at both output junctions. The impedance ratio nay be measured and used in conjunction with the known current limiting impedance to determine the total impedance of the sensing element. When the initial RC voltage curve is measured, the baseline parasitic capacitance can be determined as a function of the known total impedance and measured RC rise time.

The purpose of sensing a return signal from both ends of the fabric enables the sensor 100 to account for both the unknown total impedance and induced capacitance but also allows the sensor to discriminate between the position of the touch input and the touch force by providing two independent variables as output. The touch position and touch force are coupled as a function of the signal rise times—the touch position itself is coupled as a function of the linear length of the sensing element. A method of measuring binary force (touch/no touch) involves simple thresholding when either rise time crosses a certain predetermined value. Linear distance is calculated as the difference between the values of the two rise times. Linear distance x may be approximated from the rise times $t_{rA}$ and $t_{rB}$ by $x \approx \log(t_A)/\log(t_{rB})$ Calculation of Unknown Resistances The sensing element 100 contains three resistive elements, RA, R_B, and R_C. Resistances R_A and R_B are the contributions of the current limiting resistors (312, 322 in FIG. 3) and R_C 412 (FIG. 4) represents the total resistance of the sensing element 100.

The normalized resistances are shown in equations (1a) and (1b).

$$\frac{R_i}{R_A + R_B + R_C} = \hat{R}_i, i = A, B, C \quad \text{Equation (1a)}$$

$$\hat{R}_A + \hat{R}_B + \hat{R}_C = 1 \quad \text{Equation (1b)}$$

When measuring coarse single touch input, leakage current out of the system, $I_{A_p}$ and $I_{B_p}$, is assumed to be less than the main branch currents, $I_A$ and $I_B$, due to a high filter input impedance.

$$I_{A_p} << I_A, I_{B_p} << I_B$$

During calibration, voltage at alternate ends of the sensor is set high and low to direct current towards either output terminal and generate uniform current flow. The normalized voltage at either input terminal is measured and used to determine the unknown normalized resistances through formulas (2a) and (2b).

$$\hat{V}_A I = \hat{R}_A \quad \text{Equation (2a)}$$

$$(1 - \hat{V}_B) I = \hat{R}_B \quad \text{Equation (2b)}$$

Detecting Touch Position

The transient response of the output signal given a step input of magnitude $V_{CC}$ yields a first order LTI system equation in (3).

$$V(t) = V_{CC}(1 - e^{-\frac{t}{RC}}), t \geq 0 \quad \text{Equation (3)}$$

Where R and C are the respective equivalent resistance and capacitance of the circuit. Rise time, $t_r$, is defined as the time needed to reach 90% of the final, normalized signal value as shown in equation (4).

$$0.9 = 1 - e^{-\frac{t_r}{RC}} \quad \text{Equation (4)}$$

The electrical potential at the touch contact point is equivalent for both branches of the circuit, A and B. Because the output voltage at leads A and B 150, 152 is output in parallel, the responses can be equated as in equation (5a). The sensing element acts as a linear voltage divider when touch is input. The touch position, x, is defined as the normalized distance from lead A.

$$1 - e^{-\frac{t_{rA}}{(R_A + R_C x)C}} = 1 - e^{-\frac{t_{rB}}{(R_B + R_C(1-x))C}} \quad \text{Equation (5a)}$$

Equation (5a) is simplified to yield equation (5b). Notice that the induced capacitance drops out of the equation in (5c).

$$(R_B + R_C(1-x))Ct_{rA} = (R_A + R_C x)Ct_{rB} \quad \text{Equation (5b)}$$

$$R_B t_{rA} - R_A t_{rB} + R_C t_{rA} = (R_C t_{rB} + R_C t_{rA})x \quad \text{Equation (5c)}$$

$$(R_B + R_C)t_{rA} - R_A t_{rB} = R_C(t_{rB} + t_{rA})x \quad \text{Equation (5d)}$$

The equation in (5d) is rearranged to solve for x in (5e).

$$x = \frac{(R_B + R_C)t_{rA} - R_A t_{rB}}{R_C(t_{rB} + t_{rA})} \quad \text{Equation (5e)}$$

The normalized resistances are proportional to the actual resistance through equation (1a). Both the numerator and denominator are divided by the total circuit resistance to yield equation (5f).

$$x = \frac{(\hat{R}_B + \hat{R}_C)t_{rA} - \hat{R}_A t_{rB}}{\hat{R}_C(t_{rB} + t_{rA})} \quad \text{Equation (5f)}$$

Detecting Touch Force

Figure 5A:
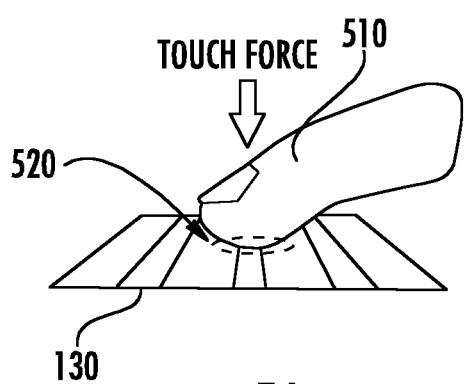
FIGS. 5A and 5B show touch force and contact area with the sensor.
Figure 5B:
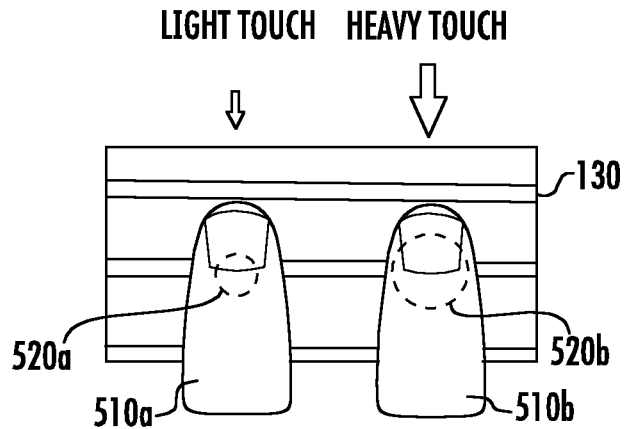

Capacitance may be represented as a function of touch contact area C=f(A), where C is capacitance and A is area, which is itself a function of contact force, A=f(F), where F is force. As shown in FIGS. 5A, and 5B, when a finger 510 makes contact with the sensing element 130 inside a contact area 520. Depending on the force applied in the touch, a light touch finger application 510*a* creates a smaller area than a heavier touch finger application 510*b* to create a larger contact area 520*b*. the skin deforms and depending on the touch force applied, the contact area increases. Touch force detection is important to discriminate between gestures like pressing, which generally has a heavy touch, and swiping, which is done with a lighter touch. The measure of capacitance, however, is influenced by the parasitic capacitance of the circuit. Parasitic capacitance is present in the sensing leads and throughout the sensing circuit. During calibration, the sensor measures the baseline rise time of the circuit as shown in Equation (6). The value $t_{r_p}$ represents the rise time as influenced by the parasitic capacitance. This value forms the baseline rise time used to distinguish touch and non-touch.

$$0.9 = 1 - e^{-\frac{t_{r_p}}{RC_p}} \quad \text{Equation (6)}$$

Binary touch can be detected by means of thresholding. A threshold rise time, $t_{r_{threshold}}$, is chosen as a value greater than the baseline rise time but less than the rise time of a light touch. A touch event occurs when either measured rise time is greater than the threshold rise time. Conversely, no touch is registered while both rise times are below the threshold rise time. The piecewise function is shown in Equation (7).

$$f(t_{r_A}, t_{r_B}) = \begin{cases} 0 & t_{r_A} \text{ and } t_{r_B} < t_{r_{threshold}} \\ 1 & t_{r_A} \text{ or } t_{r_B} \geq t_{r_{threshold}} \end{cases} \quad \text{Equation (7)}$$

An approximation of the continuous touch force is in Equation (8). The force is approximated by averaging the rise times of signals A and B and subtracting the baseline rise time.

$$p = \frac{t_{r_A} + t_{r_B}}{2} - t_{r_p} \quad \text{Equation (8)}$$

Position Mapping

Mapping linear position to a 2D plane may be accomplished by means of a look up table or by analytically mapping the linear touch position via a parametric equation. Using a look up table may be useful when the sensor area is non-uniform or when there are changes in resistance that separate the linear resistance into piecewise functions. It may also be useful when discretizing the output position, such as in the case of a button array. A parametric equation is useful when continuity of output is desired, such as in the case of a track pad.

Figure 6:
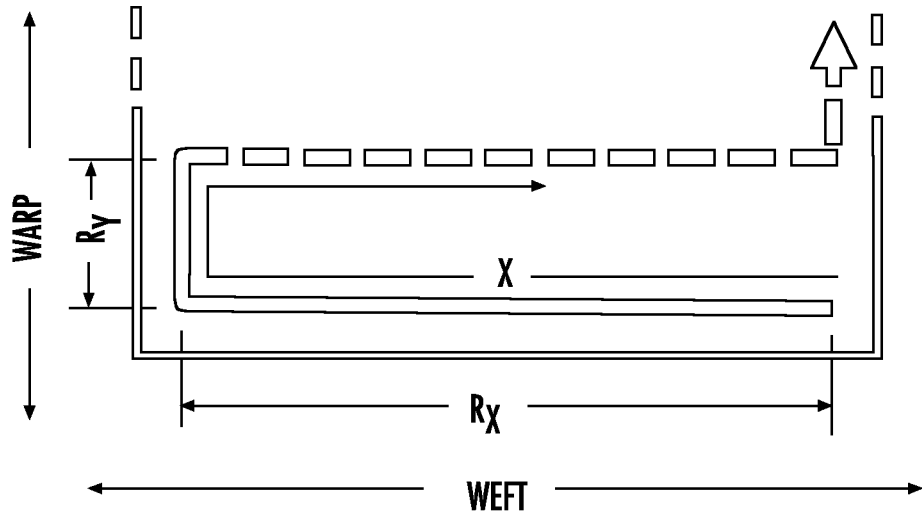
FIG. 6 shows the path of the sensing element.
Figure 7:
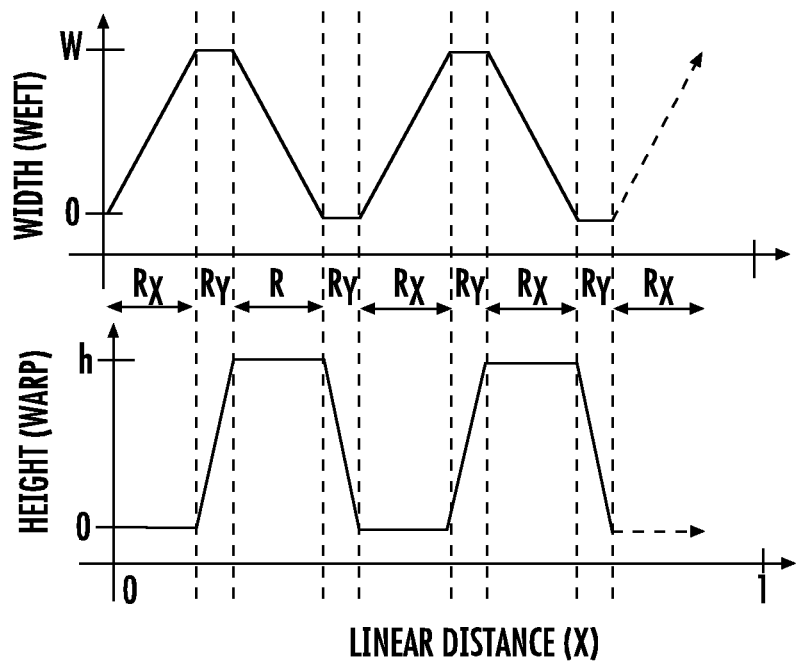
FIG. 7 shows the coordinates in the weft and warp directions as a function of x.

FIG. 6 shows the path of the sensing element. The normalized linear distance, x, acts as the independent variable of the parametric equations that define the touch location coordinates. FIG. 7 shows the coordinates in the weft and warp directions as a function of x. * * * Can you provide some more context and explanation for these figures?

Software and Drivers

The software may be used from the libraries included in the Arduino IDE and the Atmel Software Framework (ASF).

The software to sense touch may run embedded on the microcontroller used to interface with the knitted fabric sensor. The microcontroller may stream data over a serial port to a connected PC. Ancillary software and drivers are currently being developed to visualize touch input but is not necessary to the functionality of the sensor.

The software may enable application for the sensor, but software choices may vary.

Sensor Design

A planar (two-dimensional, XY location) touch sensor with multi-touch and multi pressure sensing capabilities includes a knitted structure and supplementary method of sensing that detects human touch on a fabric surface. This sensor may be fully knitted and may detect the continuous planar location and contact force of human touch along the surface of the structure. In addition, the sensor may be knitted to conform to any arbitrary surface but is commonly knitted as a rectangle for touch pad applications. This sensor may have certain applications including those discussed above and including robotics and human-machine interaction, smart garments and wearables, as well as medical textiles and flexible embedded sensors.

Sensor Design

Figure 8A:
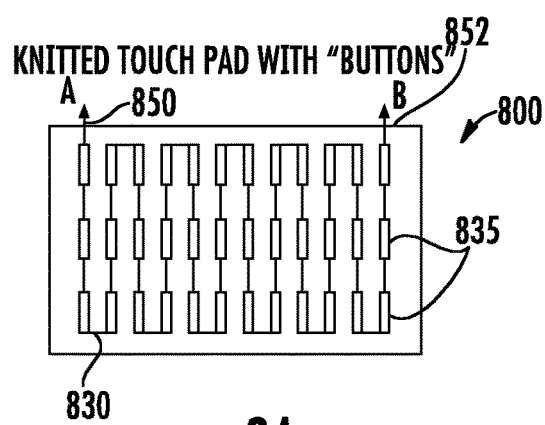
FIGS. 8A-D show alternative sensor designs.

The sensor designs shown in FIGS. 8A-D show possible planar knitted shapes with the sensing element and although these designs are shown in the context of this discussion about a multi-touch sensor, some of the design elements are applicable to the other sensing elements. The placement of the sensing element in all designs is non-intersecting. The first shape in FIG. 8A represents a touch pad 800 including a sensor 830 with buttons 835 that are connected continuously between both inputs 850, 852. The buttons 835 may be knitted into the top layer of the structure and are not tactile—they detect change in capacitance caused by applied pressure. The buttons 835 may be formed by knitting the conductive yarn above or below the surface of the top layer discussed earlier with respect to FIG. 1.

Figure 8B:
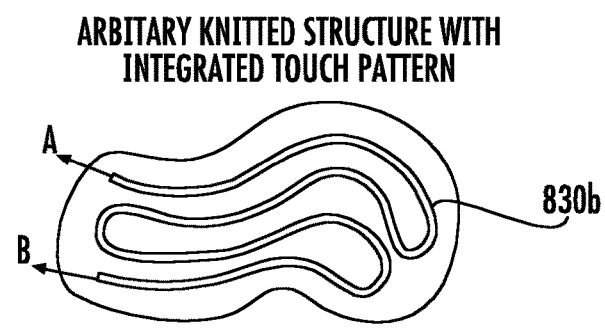
Figure 8C:
Figure 8D:
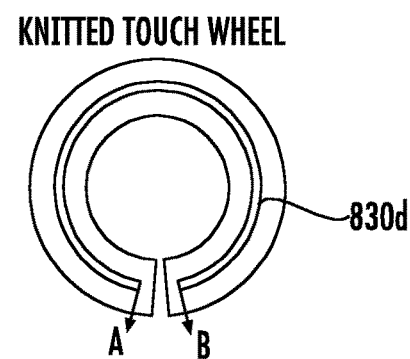

The second shape in FIG. 8B shows a sensor 830b an arbitrary 2D planar shape with an arbitrary, non-intersecting sensing element path. The third and fourth shapes in FIGS. 8C and 8D show knitted pattern sensors 830c, 830d for capacitive sliders in the form of a linear slider and wheel respectively. All patterns may be able to detect multiple touch points, each with distinct touch pressures.

Figure 9B:
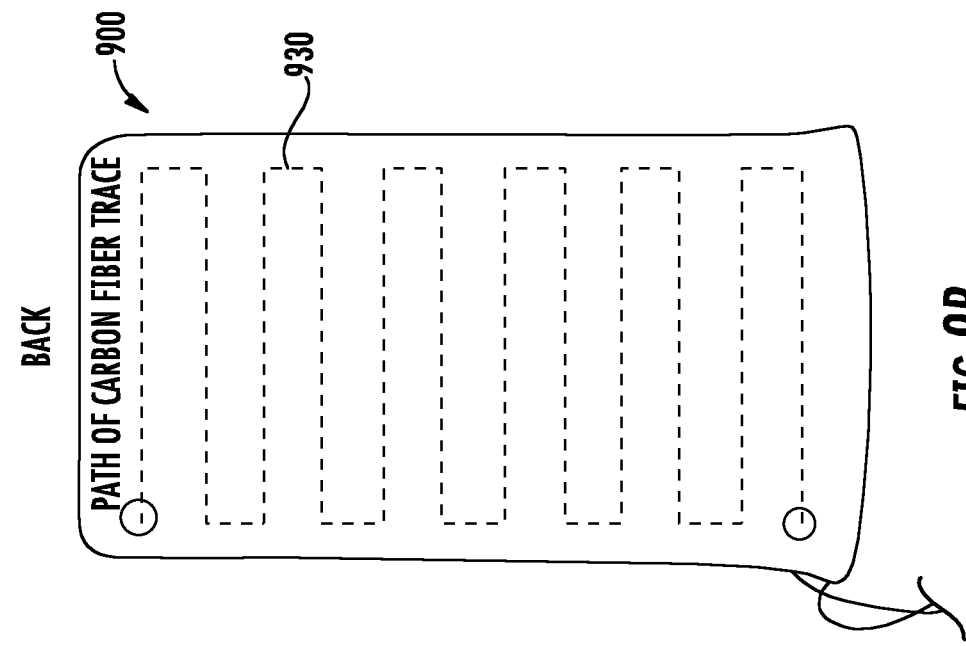
FIGS. 9A and 9B show a sensor embodiment with buttons.
Figure 9A:
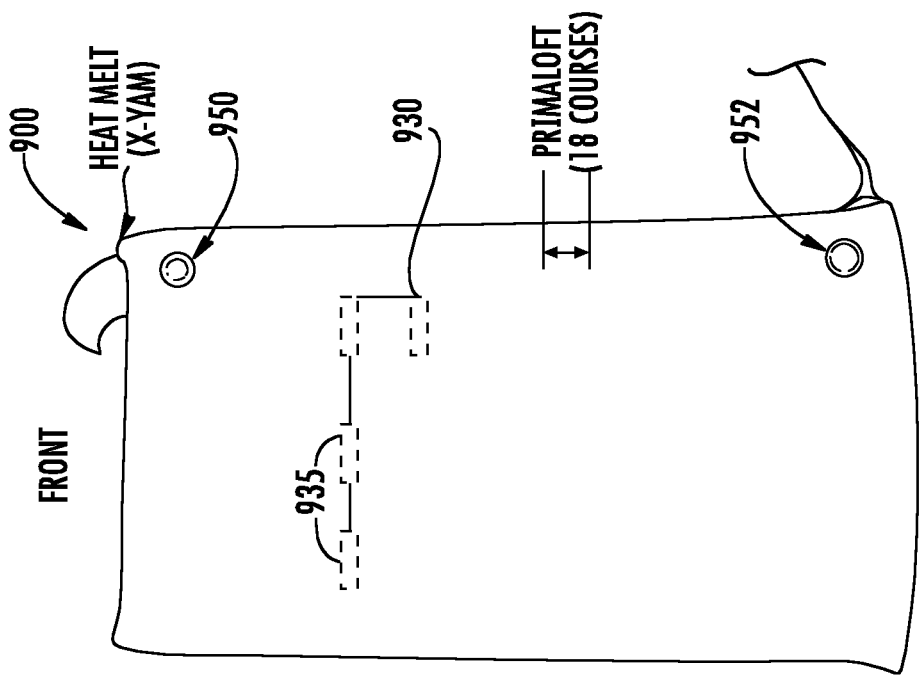

As shown in FIGS. 9A and 9B, which show alternate embodiments of the touch pad 800 in FIG. 8A, the touch pad 900 includes buttons 935 and as outputs, conductive snaps 950, 952 (the sensor path in FIG. 9A is shown on a white background to make it more visible). The carbon fiber yarn sensor may be knitted in a continuous path traversing the face of the sensor alternating in the horizontal (weft) direction from the base to the top (warp) of the rectangular structure as the path of the carbon fiber trace. Additionally, the structure may include a heat melt yarn at the top seam that is steam-sealed to prevent the fabric from unraveling. Electrodes may connect to the conductive snaps 950, 952 at electrode outputs A and B. FIG. 8B shows the path of the sensor 930 through the touch pad 900.

Sensing

Figure 10A:
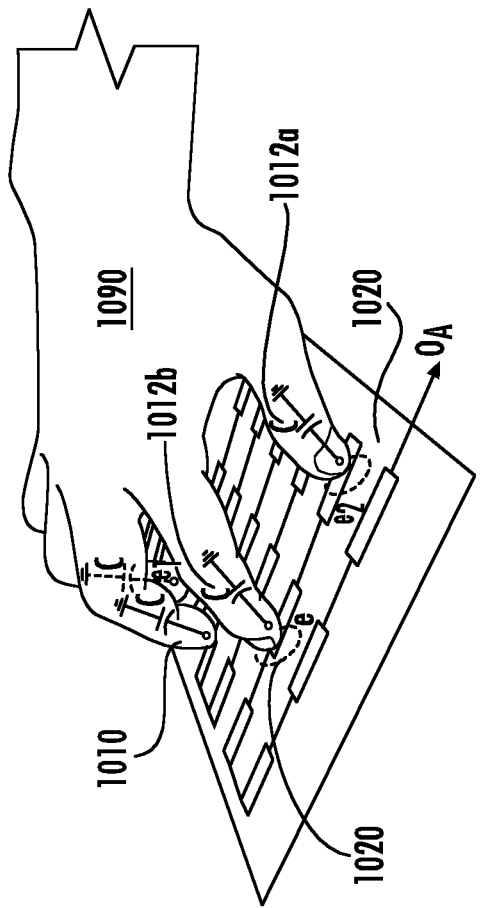
FIGS. 10A and 10B show a button touchpad and corresponding circuit.
Figure 10B:
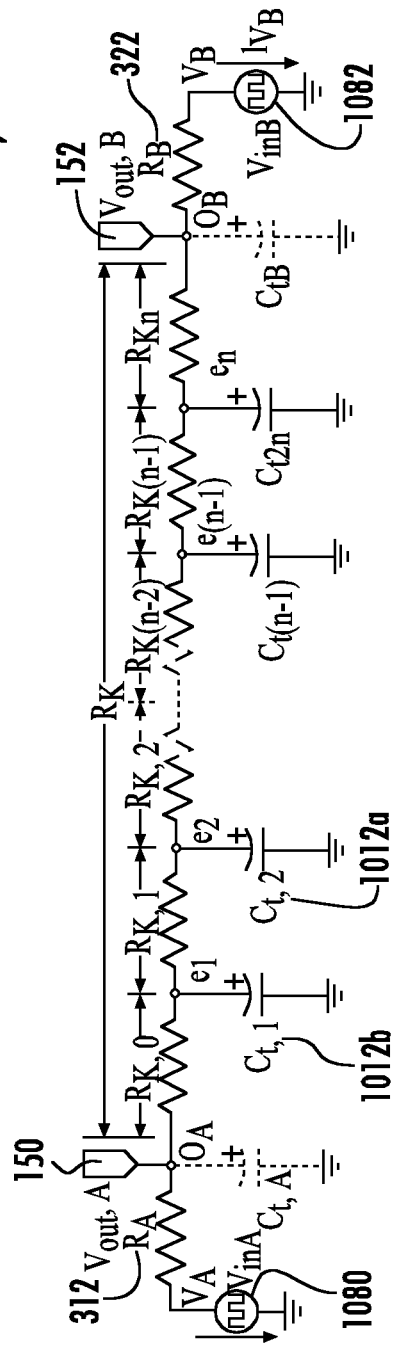

The sensing method uses projected self-capacitance to measure both the location and pressure of human touch. FIG. 10A shows a user's hand 1090 pressing multiple touch points 1020 with each finger 1010 applying a distinct capacitance 1012a, 1012b, etc. The circuit 1000 shown in FIG. 10B is charged from a step response or square wave input at points $V_A$ 1080 and $V_B$ 1082. The resulting charge is absorbed through a combination of the touch points 1020 and the parasitic capacitance of the circuit 1000. In multi-touch and multi pressure sensing, the shape of the output waveform is analyzed to determine the pole-zero placement of the system which correlates to the touch capacitance and touch location.

Figure 11:
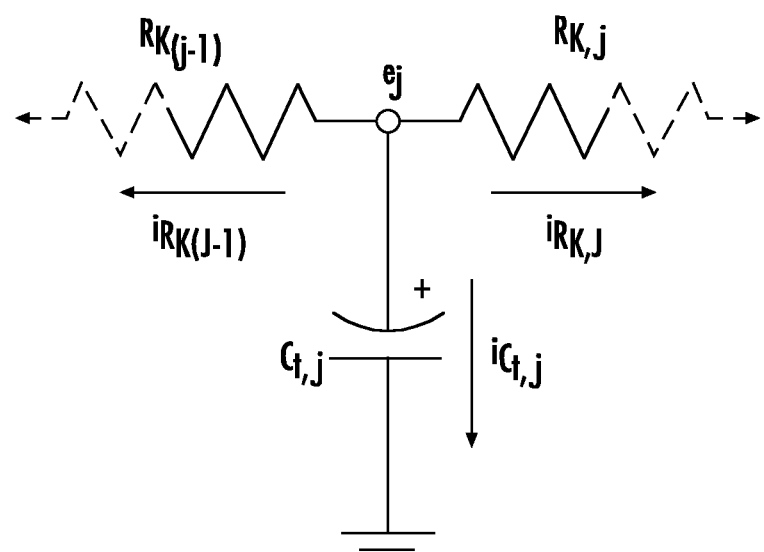
FIG. 11 shows a node current diagram.

The flow of current at each touch point is depicted in the node diagram in FIG. 11. Current flow out of the node represents a positive current. Each node has a total current summation of zero as defined in Kirchoff's Current Law.

Calculations Using Circuit

Using modified nodal analysis (MNA) and the circuit diagrams in FIGS. 10B and 11, the mathematical representation of the circuit's electrical behavior may be found. For each node, the current moving towards a lower voltage potential out of the node is considered positive. The current between the nodes of a resistor is found in Equation 9a while the current between the nodes of a capacitor is found in Equation 9b. In the case of the second equation, the tem s represents the Laplace variable. The conductivity, G, is equal to the inverse of the resistance R.

$$i = \frac{\Delta V}{R} = G(\Delta V), G = R^{-1} \quad \text{(Equation 9a)}$$

$$i = C\left(\frac{d}{dt}\Delta V\right) = C(\Delta V s) \quad \text{(Equation 9b)}$$

The total current exiting a touch point node can be found using Equation 10.

$$\frac{e_j - e_{j-1}}{R_{K_{j-1}}} + \frac{e_j - e_{j+1}}{R_{K_j}} + C_{t_j} e_j s = \quad \text{(Equation 10)}$$

$$G_{K_{j-1}}(e_j - e_{j-1}) + G_{K_j}(e_j - e_{j+1}) + C_{t_j} e_j s = 0$$

The general circuit diagram can be written in matrix form as shown in Equation 11, FIG. 12.

To solve for the output voltages, $o_A(s)$ and $o_B(s)$, use Cramer's Rule (Equations 12a, 12b, and 12c) to substitute the solution vector into the columns of the matrix whose elements we wish to solve for $o_A(s)$ as shown in Equations 12a, 12b, and 12c in FIGS. 13A-C. The output in both cases yields strictly-proper transfer functions—the order of which is n+2, where n is the number of touch points. The variables of the equation are as follows:

$G_A$: Known; Measurable $G_B$: Known; Measurable $G_K$: Known; Measurable $G_{K_0} \ldots G_{K_{n-1}}$: Unknown $G_{K_n}$: Calculable from $G_K - \sum_{n-1}^{i=0} G_{K_i}$ $C_{t_1} \ldots C_{t_n}$: Unknown $C_{P_A}$: Unknown $C_{P_B}$: Unknown Determining the Knitted Resistance The first three unknown terms, $R_A$, $R_B$, and $R_K$, are measured by applying a positive voltage to one input while grounding the second input. The measured voltage across outputs A and B yield the ratio of the resistances.

FIG. 14 summarizes the No Touch scenario mathematics that yields the second order system $V_{o_A}(s)$ which is summarized in FIG. 15.

Because of the near pole-zero cancellation, the dominant pole may be a real-axis pole and because the transient response is primarily first-order, the dominant pole is closer to the right-hand side of the plot. Thus, the term beneath the radical is positive and the resultant of the operation is positive.

Time domain response:

$$v_A(t) = V_{CC}(1 - e^{\lambda t}) \quad \text{(Equation 15)}$$

with 5 measured terms and 5 degrees of freedom may be further expanded as shown in FIG. 16.

Single Touch

The single touch mathematics may be seen as follows.

$$\begin{bmatrix} G_A & -G_A & 0 & 0 & 0 & 1 & 0 \\ -G_A & (G_A + G_{K_0} + sC_{P_A}) & -G_{K_0} & 0 & 0 & 0 & 0 \\ 0 & -G_{K_0} & (G_{K_0} + G_{K_1} + sC_{t_1}) & -G_{K_1} & 0 & 0 & 0 \\ 0 & 0 & -G_{K_1} & (G_{K_1} + G_B + sC_{P_B}) & -G_B & 0 & 0 \\ 0 & 0 & 0 & -G_B & G_B & 0 & 1 \\ 1 & 0 & 0 & 0 & 0 & 0 & 0 \\ 0 & 0 & 0 & 0 & 1 & 0 & 0 \end{bmatrix} \begin{bmatrix} v_A \\ o_A \\ e_1 \\ e_2 \\ e_3 \\ o_B \\ v_B \\ i_{V_A} \\ i_{V_B} \end{bmatrix} = \begin{bmatrix} 0 \\ 0 \\ 0 \\ 0 \\ 0 \\ 0 \\ V_A \\ V_B \end{bmatrix} \quad \text{(Equation 16)}$$

$$V_{o_A}(s) = G_A G_B G_{K_0} V_A + G_A G_B G_{K_1} V_A + G_A G_{K_0} G_{K_1} V_A + G_B G_{K_0} G_{K_1} V_B + \quad \text{(Equation 17)}$$

$$C_{P_B} C_{t_1} G_A V_A s^2 + C_{P_B} G_A G_{K_0} V_A s + C_{P_B} G_A G_{K_1} V_A s + C_{t_1} G_A G_B V_A s + C_{t_1} G_A G_{K_1} V_A s$$

$$s^0: G_A G_B G_{K_0} + G_A G_B G_{K_1} + G_A G_{K_0} G_{K_1} + G_B G_{K_0} G_{K_1} \quad \text{(Equation 18)}$$

$$s^1: C_{P_B} G_A G_{K_0} + C_{P_B} G_A G_{K_1} + C_{t_1} G_A G_B + C_{t_1} G_A G_{K_1} \quad \text{(Equation 19)}$$

$$s^2: C_{P_B} C_{t_1} G_A \quad \text{(Equation 20)}$$

-continued $$\Delta = G_A G_B G_{K_0} + G_A G_B G_{K_1} + G_A G_{K_0} G_{K_1} + G_B G_{K_0} G_{K_1} + C_{P_B} G_A G_{K_0} s + \\ C_{P_B} G_A G_{K_1} s + C_{P_A} G_B G_{K_0} s + C_{P_A} G_B G_{K_1} s + C_{P_A} G_{K_0} G_{K_1} s + C_{P_B} G_{K_0} G_{K_1} s + \\ C_{t_1} G_A G_B s + C_{t_1} G_A G_{K_1} s + C_{t_1} G_B G_{K_0} s + C_{t_1} G_{K_0} G_{K_1} s + C_{P_A} C_{P_B} C_{t_1} s^3 + C_{P_A} C_{P_B} G_{K_0} s^2 + \\ C_{P_A} C_{P_B} G_{K_1} s^2 + C_{P_B} C_{t_1} G_A s^2 + C_{P_A} C_{t_1} G_B s^2 + C_{P_A} C_{t_1} G_{K_1} s^2 + C_{P_B} C_{t_1} G_{K_0} s^2$$ (Equation 21)

$$a_0 = C_{P_A} C_{P_B} C_{t_1}$$ (Equation 22)

$$a_1 = C_{P_A} C_{P_B} G_{K_0} + C_{P_A} C_{P_B} G_{K_1} + C_{P_B} C_{t_1} G_A + C_{P_A} C_{t_1} G_B + C_{P_A} C_{t_1} G_{K_1} + C_{P_B} C_{t_1} G_{K_0}$$ (Equation 23)

$$a_2 = C_{P_B} G_A G_{K_0} + C_{P_B} G_A G_{K_1} + C_{P_A} G_B G_{K_0} + C_{P_A} G_B G_{K_1} + \\ C_{P_A} G_{K_0} G_{K_1} + C_{P_B} G_{K_0} G_{K_1} + C_{t_1} G_A G_B + C_{t_1} G_A G_{K_1} + C_{t_1} G_B G_{K_0} + C_{t_1} G_{K_0} G_{K_1}$$ (Equation 24)

$$a_3 = G_A G_B G_{K_0} + G_A G_B G_{K_1} + G_A G_{K_0} G_{K_1} + G_B G_{K_0} G_{K_1}$$ (Equation 25)

$$\frac{a_1}{a_0} = \frac{G_A + G_{K_0}}{C_{P_B}} + \frac{G_B + G_{K_0}}{C_{P_A}}$$ (Equation 26)

$$\frac{a_2}{a_0} = \frac{G_A G_B + G_A G_{K_0} + G_B G_{K_0}}{C_{P_A} C_{P_B}}$$ (Equation 27)

Controllable Canonical Form $$A = \begin{bmatrix} 1 & 0 & 0 \\ 0 & 1 & 0 \end{bmatrix}$$ (Equation 28)

Pole Locations $$\lambda_A = \begin{bmatrix} \phantom{xx} \end{bmatrix}$$ (Equation 29)

Two or More Touch Points

Figure 18:
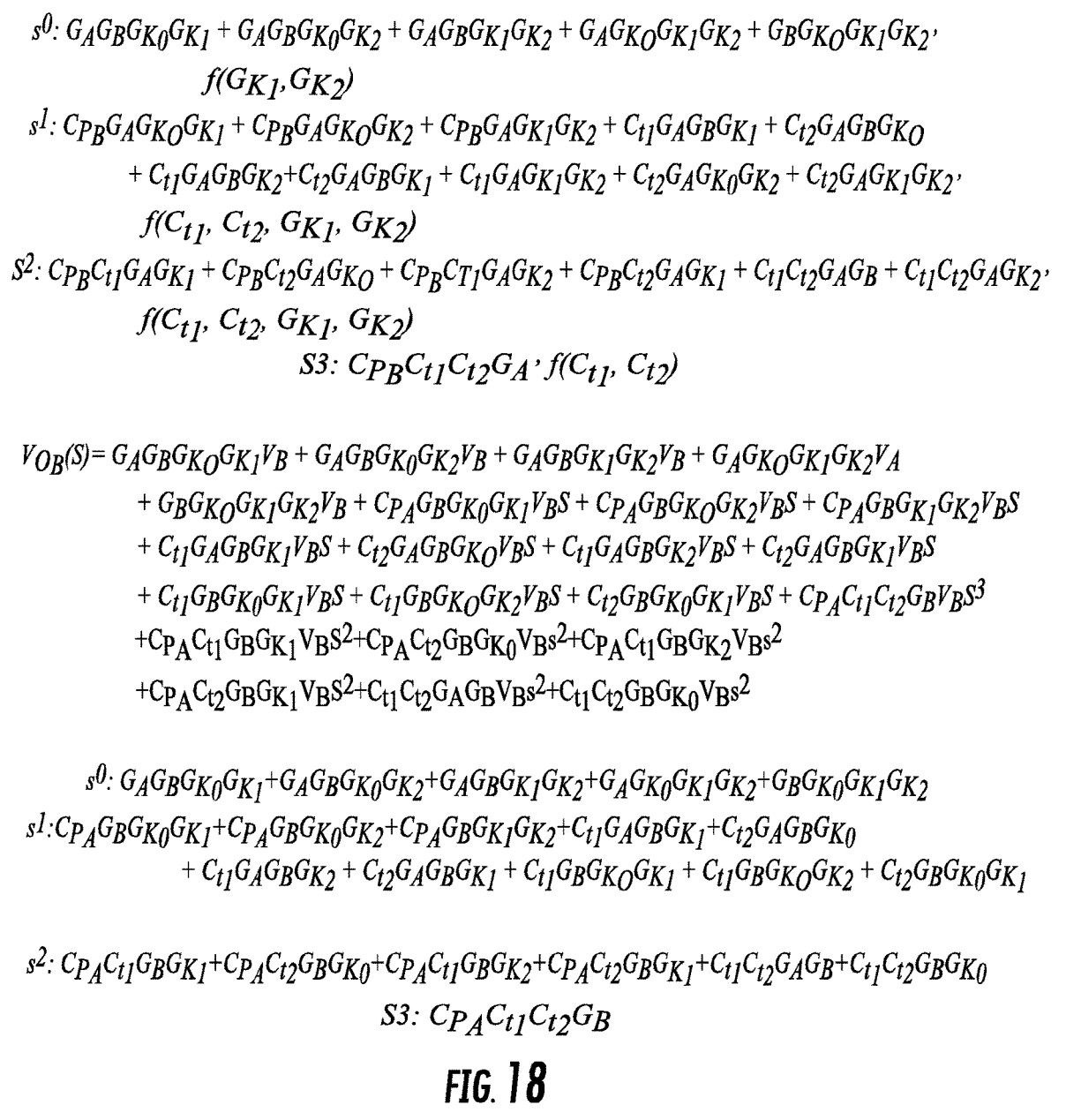

The output voltage signals from a multi-touch input exhibit a similar transient response as a single-touch input or no touch in that the higher-frequency poles are paired close to corresponding zeros and the unpaired pole is slower-moving and dominates the behavior of the transient response, that mathematics for which is summarized in FIGS. 17 and 18.

Example Applications

An example application of the sensor involves its use as a touch sensor for a humanoid robot. The sensor swatches are placed on the arms of the robot and are used to detect human touch. Touching different locations of the sensor controls the movement of the arms to move towards or away from the location of touch.

Another example application of the sensor involves its use as a track pad to move a cursor on a computer screen. The sensor measures planar location on a rectangular swatch and converts the position into the movement of the cursor.

How Capacitive Sensing Works

Figure 19A:
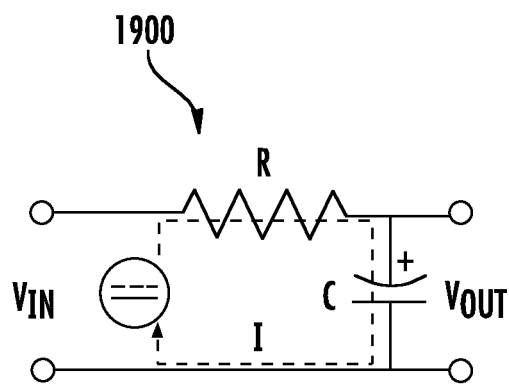
FIGS. 19A and 19B show a series RC circuit with its plotted output.
Figure 19B:
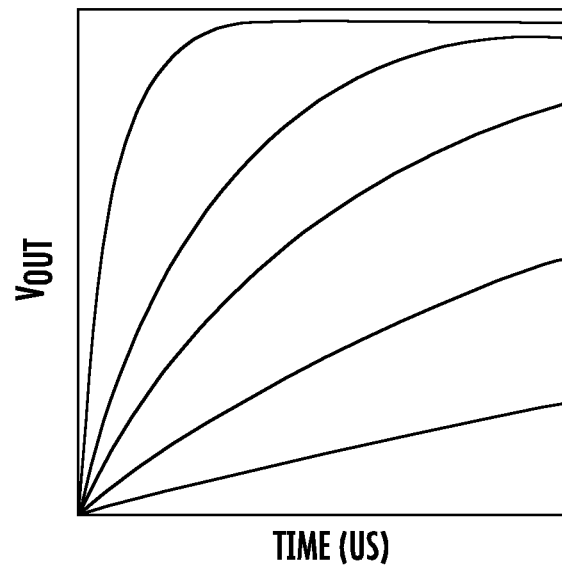

Projected-capacitive sensors are among the most commonly used touch sensors in computing and mobile devices. A capacitive sensor is a measurement device that converts a measured change in capacitance into a continuous or discrete output. In the case of detecting human touch, a capacitive sensor may measure the induced capacitance of the human body through the change in the dielectric coefficient to detect whether or not a touch has occurred. A basic capacitive sensor uses a resistor and capacitor in series to form a circuit 1900 as shown in FIG. 19A, and its corresponding time vs Vout graph FIG. 19B. The input is driven by a simple on-off voltage generator, $V_{in}$, and the output is a change in the voltage waveform across the capacitor, $V_{out}$. The circuit 1900 is modeled as a first-order linear ordinary differential equation. The capacitor is sensitive to changes in charge and the resistor is sensitive to changes in current (derivative of voltage). Furthermore, because only one branch current is present in the circuit 1900, only a single measured point (time-voltage pair) is needed to determine the value of the capacitance given a known input voltage and resistance. As the values of both resistance and capacitance increase, the time constant, $\tau$, increases. $\tau$ is defined as the resistance multiplied by the capacitance of the circuit. In the case of measuring the capacitance of human touch, the induced capacitance is small—in the range of 10's of Pico-Farads. Thus, a large series resistance is needed to measure the rise time while using a modest sampling interval.

Theory of Materials/Yarns

In the sensor described herein, the touch sensor structure combines with resistive and non-resistive yarns to create an alternating grid-like pattern. The main body of the knit structure, which is non-resistive, may be made from two ends of Primaloft® yarn, (50% Primaloft, 50% wool, 3.5 twists per inch) and the sensing element may be made from a filament carbon fiber yarn with a linear resistance of approximately 1 MΩ/in. Carbon fiber may be chosen as the sensing element material because of its high resistivity. Furthermore, the linear resistance of the yarn may be tailored to match the desired total resistance of approximately 1 MΩ by twisting multiple filaments together. The carbon fiber yarn that may be used in the sensor may be made from a commercially available carbon fiber monofilament (Resistat, Type F901, Merge 5022, 22 Denier, 24 Dtex from Shakespeare Conductive Fibers). To produce a yarn with the desired resistance, 32 ends of carbon fiber monofilament may be twisted together using a Simet Twisting Machine following the steps illustrated in FIG. 20, and summarized earlier with reference to FIG. 2.

Figure 20:
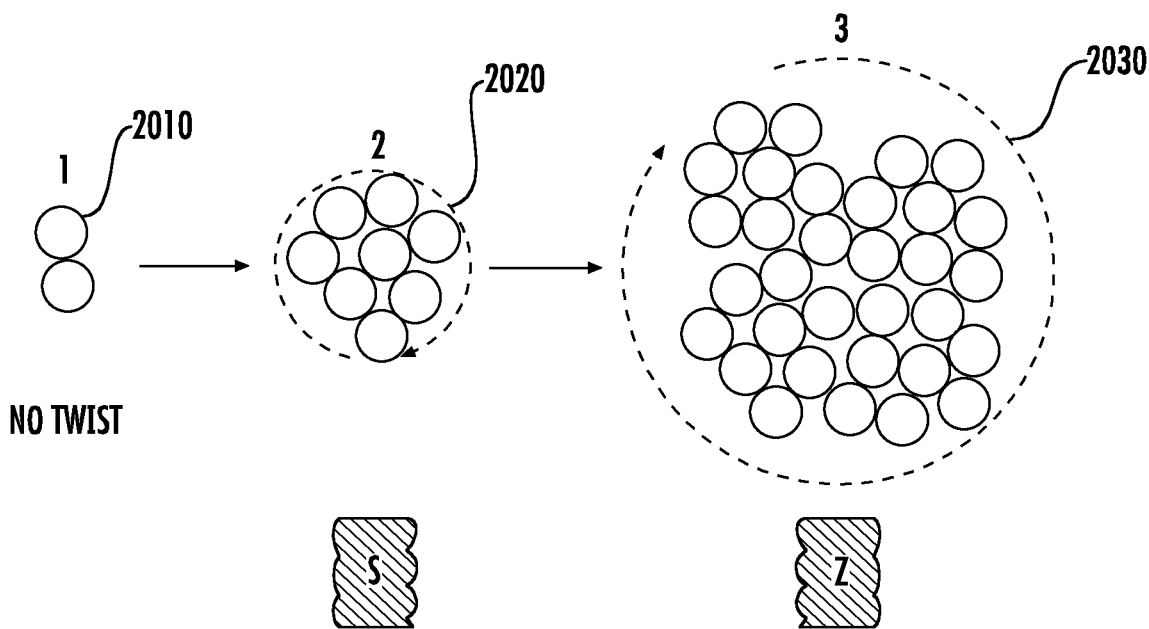
FIG. 20 shows a series of steps in creating conducting elements using threads.
Figure 23:
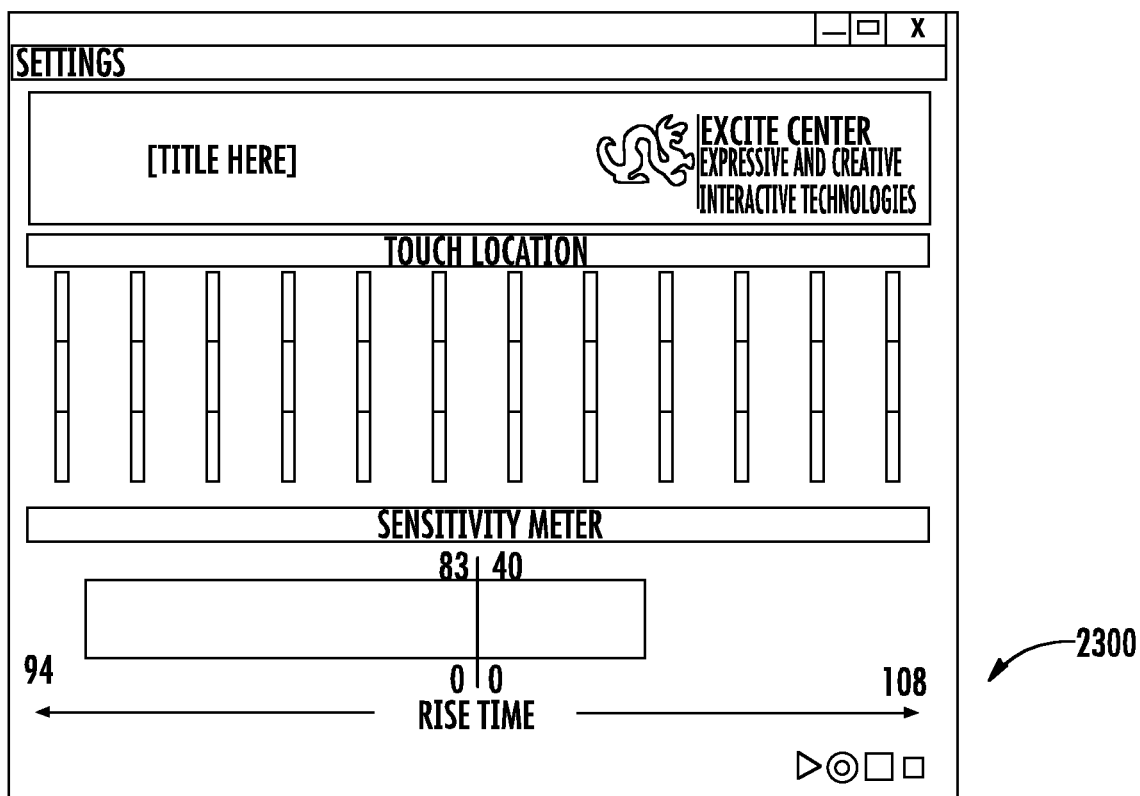
FIG. 23 shows a fabric sensor GUI.

In FIG. 20, two ends of carbon filament were wound together onto four individual cones, 2010. The four cones from step one were S-twisted together and wound onto four new cones, 2020. The four cones from step two were then Z-twisted together onto one cone, 2030.

Theory of Knit Structures

While resistance can be changed by using different types of resistive yarns, other techniques to alter the resistance of the sensor involve changing the knit architecture. This can mean increasing the number of courses and wales—by increasing the length of the courses (the horizontal dimension of the knit) which increases the resistance or by increasing the wales (the vertical dimension of the knit) which decreases the resistance.

Architecture can also mean changing the area of the pattern and contact arrangement of the yarn by creating an interlock patterns. Interlock patterns 2100 create thicker courses by drawing more yarn across the needle bed (FIG. 21A). The pattern misses (floats) stitches between knit stitches to deposit more material over multiple passes. A technique to increase the thickness of the pattern itself involves the use of "spacer yarn" that tucks between the front and back needle beds to fill in the gap (FIG. 21B) and creates a hybrid pattern 2110. The spacer yarn "bulks up" the fabric to create a spongy texture, an architecture for touch sensors.

Theory of Sensing and Operation

As described previously, capacitive sensing may be measured through changes in voltage. The sensing circuit 2200 depicted in FIG. 22 models the touch pad as having a continuous linear resistance, $R_K$. When the sensor is touched at a point, a pathway to ground is created. The continuous resistance is then split into two resistances, $R_K x$ and $R_K(1-x)$ that are proportional to the normalized touch location, x.

The sensor detects the linear touch location by measuring the rise and fall times of the voltage outputs, $V_{out}$, at either end of the knitted fabric sensor. A square wave pulse is generated at the sources, $V_{in}$, and passed through current limiting resistors, $R_A$ and $R_B$. The values of $R_A$, $R_B$, and $R_K$ should match as closely as possible to provide the best range of output. Inexact matching of resistors $R_A$ and $R_B$ will cause skewed voltage readings and the reported touch location will be biased towards the higher value resistor.

The voltage sensing is performed by an external microcontroller (Atmel SAM3X8E). T The microcontroller may generate a 500 Hz square wave input with a 50% duty cycle to both input leads of the current limiting resistors, though the frequency may vary. The pulses are timed to charge and discharge synchronously. Capacitance and position are measured by recording the time needed to charge the circuit to ½ of the microcontroller's output voltage. These times range from 10 to 70 microseconds depending on the touch pressure and relative charge of the individual. Touch interactions induce oscillations in the output waveform and skew the measured rise time. Filtering is performed on the rise time data through a simple moving average. The operation steps are listed in Table 1.

| Step | Fabric circuit sensing procedure. |
|---|---|
| 1 | The circuit is discharged; the input signal is pulsed HIGH. |
| 2 | The system time is recorded as the starting time of the rising signal |
| 3 | Hardware interrupts trigger for each output terminal that measures when the signal crosses the low threshold. |
| 4 | The interrupts return the system time at the instant upon reaching ½ rise time as the ending time. |
| 5 | The microcontroller returns the difference of the starting and ending times. |
| 6 | The circuit is charged; the input signal is pulsed LOW. |
| 7 | The system time is recorded as the starting time of the falling signal. |
| 8 | Hardware interrupts trigger for each output terminal that measures when the signal crosses the high threshold. |
| 9 | The interrupts return the system time at the instant upon reaching ½ fall time as the ending time. |
| 10 | The microcontroller returns the difference of the starting and ending times. |

Modeling and Simulation

In order to verify the observed circuit behavior, the circuit and touch interactions were modeled using MATLAB Simulink and Simscape Electrical Foundation Library. A relationship was sought that decouples the touch location and capacitance given two output rise times. This relationship is useful for creating a capacitance-invariant touch position model to sense touch location from different users, each with their own baseline charge.

A model of the physical circuit and microcontroller functions was simulated over a range of touch positions and capacitances spanning from 1 to 200 pico-Farads to determine a model that decouples the touch location and touch pressure from the output rise times. Though a 30 to 60 Hz oscillation was present in waveforms observed from the physical circuit, no attempt was made to replicate this noise in the simulated model.

Graphical User Interface

A graphical user interface (GUI) 2300 was created to indicate the registered touch location and pressure to provide visual feedback during testing. The GUI indicates the touch location on the vertical black bars by means of an indicator. The program uses a simplistic algorithm to determine the touch location by taking the difference of the A and B electrode readings and dividing by the sum of the readings. This value indicates the offset from the center of the pad. For instance if readings A and B are equal, the output value will be close to the center of the pad. If reading A is much greater than reading B, the value will skew towards the position of electrode A and vice-versa. The sensitivity meter displays the raw readings from the electrodes along with the maximum readings from each to assess imbalances in the sensing circuit.

Results and Discussion

To verify the modeled data, the simulated output was compared against real world data. Data was collected from six individuals who were asked to press on all 36 discrete sensor pads. 100 data samples were taken per individual per pad, amounting to 600 data points per pad for 36 pads. To convert the pad locations to a real numbered position, the data was labeled with the normalized distance between the two endpoints, ranging from 0 to 1 in divisions of 35. Aside from a simple moving average applied to the data within the microcontroller, no additional filtering was applied. Furthermore, only the position information was recorded during testing. The touch capacitance was not measured. This was due in part to the inability to accurately measure capacitance in the experimental setup but also to verify the hypothesis that the measured touch location would be invariant to the touch capacitance. No calibration procedure was performed on the sensor in between testing to simulate the effect of real world use.

While each individual exhibited a different base charge per dataset, the overall spread of the data matched the expected output provided by the simulation. Data from individuals who had a higher touch capacitance showed a more pronounced spread between discrete touch points. This matches the predicted distribution of the position as touch capacitance increases. Furthermore, the separation of data between the left, middle, and right regions of the pad is distinct and indicates that coarse touch location can be accurately performed. Quantitatively, the data had a root-mean-square error (RMSE) value between the expected and observed values of 0.225. This error physically correlates to a misclassification of the normalized distance of approximately one-fourth of the length of the sensing element. The discrepancy between the model data and the data collected is likely a result of differences in the model's assumed resistance versus the actual resistance and from the induced noise.

While the invention has been described with reference to the embodiments above, a person of ordinary skill in the art would understand that various changes or modifications may be made thereto without departing from the scope of the claims.

The invention claimed is:

1. A touch sensor structure comprising:
   a conductive sensing element layer comprising a conductive yarn and having two exit outputs, wherein the conductive yarn comprises a multi-strand twisted monofilament carbon fiber yarn;
   a nonconductive layer that provides a backing for the conductive sensing element layer and prevents unwanted electrical contact with the sensing element layer; and
   a spacer fabric layer that resists longitudinal deformation of the conductive sensing element layer;
   wherein upon a capacitive touch on the sensing layer, the touch sensor structure can determine a position of the touch;
   wherein the conductive sensing element layer comprises the two exit outputs;
   wherein the two exit outputs comprise a first exit output and a second exit output, wherein the first exit output is connected to a first input and a second exit output is connected to a second input;
   wherein a microcontroller generates a wave input with a 50% duty cycle to each of the first input and second input, wherein the wave input pulses are timed to charge and discharge synchronously;
   wherein a first current limiting resistor is located between and directly connected to the first input and the first exit output, and the first exit output is located between and directly connected to the first current limiting resistor and the sensing element layer; and
   a second current limiting resistor is located between and directly connected to the second input and the second exit output, and the second exit output is located between and directly connected to the second current limiting resistor and the conductive sensing element layer.

2. The touch sensor structure of claim 1, wherein the nonconductive layer and the sensing element layer enclose the spacer fabric layer.

3. The touch sensor structure of claim 1, wherein the conductive sensing element layer comprises a continuous strip that traverses a face of the touch sensor structure.

4. The sensor structure of claim 3, wherein the continuous strip shape includes parallel rows of the sensing element layer.

5. The sensor structure of claim 4, wherein the rows are in a weft direction within the touch sensor structure.

6. The touch sensor structure of claim 1, wherein the twisting of the microfilament fiber yard occurs in two directions.

7. The touch sensor structure of claim 1, further comprising a heat melt yarn at a top seam of the touch sensor structure that is steam-sealed to prevent the touch sensor structure from unraveling.

8. The touch sensor structure of claim 1, wherein the exit outputs are snaps.

9. The touch sensor structure of claim 1, wherein the exit outputs attach to electrodes.

10. The touch sensor structure of claim 1 wherein the wave input is a 500 Hz square wave input.

11. The touch sensor structure of claim 1, wherein the capacitance of the capacitive touch is measured by comparing the voltage change between first and second current limiting resistors and the sensing element layer.

12. The touch sensor structure of claim 11, wherein the capacitive touch is introduced into the sensing element layer through the electrical potential of the human body introduced to the sensing element layer through a touch of the human body.

13. The touch sensor structure of claim 12, wherein a distance from output A to the touch of the human body on the sensing element layer is given by the formula $$x = \frac{(\hat{R}_B + \hat{R}_C)t_{r_A} - \hat{R}_A t_{r_B}}{\hat{R}_C(t_{r_B} + t_{r_A})}$$

where x is the distance, RA, RB, and RC are the resistances of the first resistor, second resistor, and sensing element layer resistance respectively, and trA and trB are the rise times from the first and second inputs respectively.

14. The touch sensor structure of claim 1, wherein the sensing element layer further comprises buttons.

15. The touch sensor structure of claim 1, wherein the sensing element layer also measures the force applied.

16. The touch sensor of claim 15, wherein the force applied is measured by measuring the capacitance of the capacitive touch.

17. The touch sensor of claim 1, wherein the first output and the second output are connected to electrodes.

* * * * *